US008492661B2

(12) United States Patent
Jol

(10) Patent No.: US 8,492,661 B2
(45) Date of Patent: *Jul. 23, 2013

(54) INHIBITING MOISTURE INTRUSION IN A VERY SMALL FORM FACTOR CONSUMER ELECTRONIC PRODUCT

(75) Inventor: Eric S. Jol, San Jose, CA (US)

(73) Assignee: Apple Inc., Cupertino, CA (US)

( * ) Notice: Subject to any disclaimer, the term of this patent is extended or adjusted under 35 U.S.C. 154(b) by 281 days.

This patent is subject to a terminal disclaimer.

(21) Appl. No.: 12/872,764

(22) Filed: Aug. 31, 2010

(65) Prior Publication Data

US 2012/0048589 A1      Mar. 1, 2012

Related U.S. Application Data

(63) Continuation-in-part of application No. 12/870,656, filed on Aug. 27, 2010.

(51) Int. Cl.
*H02G 3/18* (2006.01)
*F16J 15/00* (2006.01)

(52) U.S. Cl.
USPC ........ 174/520; 174/50; 361/679.01; 361/730; 277/628; 277/650

(58) Field of Classification Search
USPC ......... 174/50, 520, 539, 564, 59; 361/679.01, 361/600, 730; 439/587, 586; 277/628, 650
See application file for complete search history.

(56) References Cited

U.S. PATENT DOCUMENTS

| 4,584,718 | A | 4/1986 | Fuller |
| 4,683,587 | A | 7/1987 | Silverman |
| 5,666,274 | A | * | 9/1997 | Corso | 361/814 |
| 6,303,988 | B1 | * | 10/2001 | Crumly | 257/690 |
| 6,459,890 | B1 | | 10/2002 | Kim | |
| 6,961,434 | B2 | | 11/2005 | Silverman | |
| 7,409,148 | B2 | | 8/2008 | Takahashi et al. | |
| 7,697,281 | B2 | | 4/2010 | Dabov et al. | |
| D616,397 | S | | 5/2010 | Tai | |
| 8,068,331 | B2 | * | 11/2011 | Sauers et al. | 361/679.01 |
| 8,169,786 | B2 | * | 5/2012 | Mangaroo | 361/752 |
| 8,180,410 | B2 | * | 5/2012 | Kim | 455/575.1 |
| 2004/0099430 | A1 | * | 5/2004 | Scudder | 174/52.3 |
| 2006/0050903 | A1 | | 3/2006 | Chan | |
| 2006/0077777 | A1 | | 4/2006 | Fried | |

(Continued)

FOREIGN PATENT DOCUMENTS

WO     WO 2009/070960     6/2009

*Primary Examiner* — Angel R Estrada
*Assistant Examiner* — Dimary Lopez
(74) *Attorney, Agent, or Firm* — Womble Carlyle Sandridge & Rice LLP

(57) ABSTRACT

A very small form factor consumer electronic product includes at least a single piece housing having an integral front and side walls that cooperate to form a cavity in cooperation with a front opening where an edge of the side walls define a rear opening and at least some of the edges have flanges. The consumer electronic product also includes an user input assembly having a size and shape in accordance with the front opening and a clip assembly having a size and shape in accordance with the rear opening and having an external user actionable clip, a plurality of internal hooking features, and a plurality of internal latching features. The clip assembly is secured by engaging at least some of the hooking features and the flanges on the edges of the housing and engaging the latching features and corresponding attachment features on the internal support plate.

13 Claims, 28 Drawing Sheets

U.S. PATENT DOCUMENTS

| | | |
|---|---|---|
| 2007/0121973 A1 | 5/2007 | Tsang |
| 2008/0060925 A1 | 3/2008 | Weber |
| 2008/0192413 A1* | 8/2008 | Reid et al. .................... 361/679 |
| 2009/0059502 A1 | 3/2009 | Filson et al. |
| 2009/0067141 A1 | 3/2009 | Dabov et al. |
| 2009/0091879 A1 | 4/2009 | Lim |
| 2009/0175020 A1 | 7/2009 | Zadesky |
| 2009/0229113 A1 | 9/2009 | Zadesky et al. |
| 2009/0273480 A1 | 11/2009 | Mittleman et al. |
| 2010/0117841 A1 | 5/2010 | Sanford et al. |
| 2010/0126834 A1 | 5/2010 | Ikehashi |
| 2011/0170249 A1* | 7/2011 | Nunes ...................... 361/679.01 |
| 2011/0261510 A1* | 10/2011 | Liu ......................... 361/679.01 |

* cited by examiner

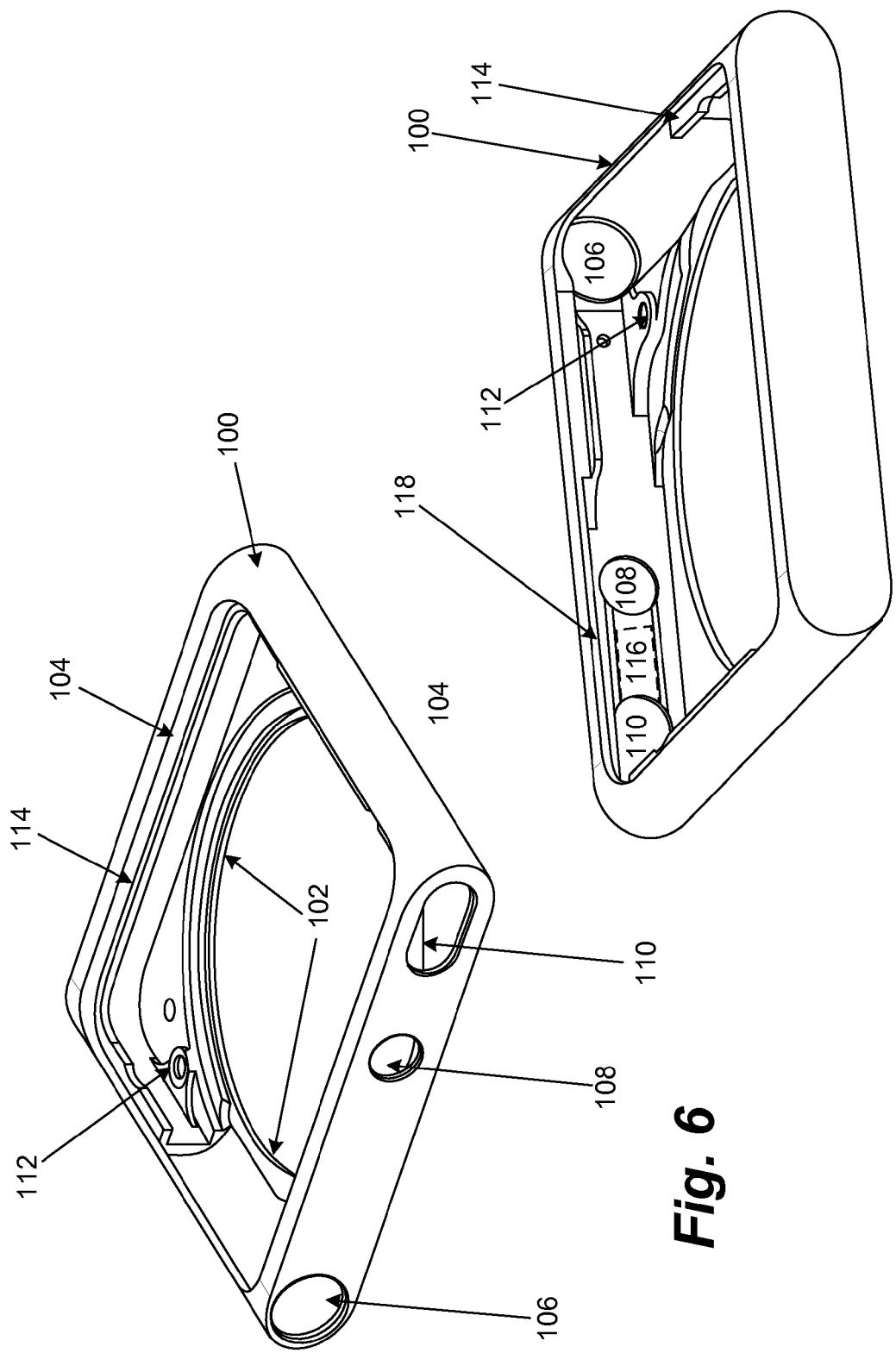

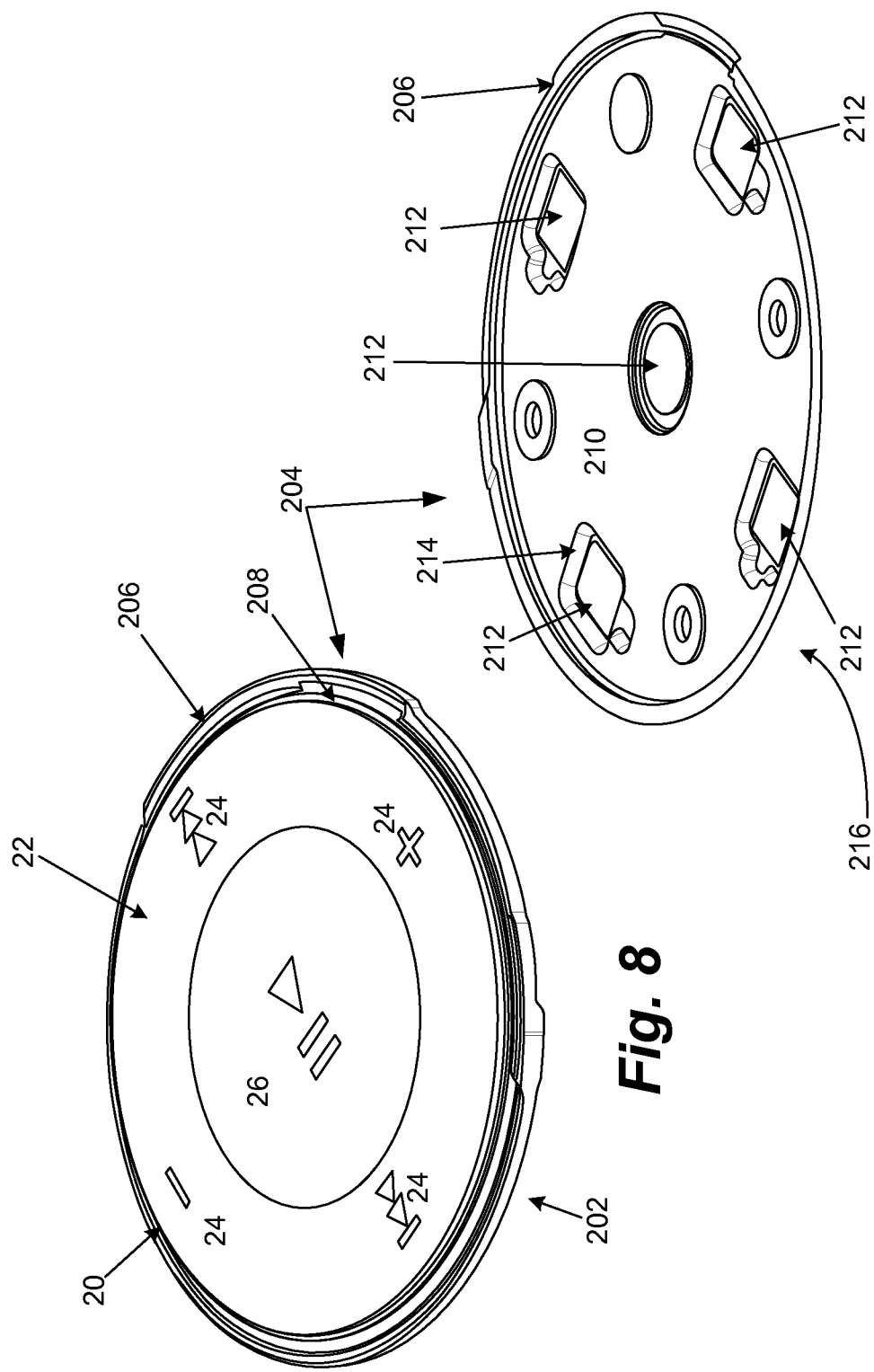

INHIBITING MOISTURE INTRUSION IN A VERY SMALL FORM FACTOR CONSUMER ELECTRONIC PRODUCT

CROSS REFERENCE TO RELATED APPLICATIONS

This patent application is a continuation in part of U.S. patent application Ser. No. 12/870,656 entitled "INHIBITING MOISTURE INTRUSION IN A VERY SMALL FORM FACTOR CONSUMER ELECTRONIC PRODUCT" by Dabov et al. filed Aug. 27, 2010

This patent application is related to and incorporates by reference in their entireties for all purposes the following co-pending patent applications filed concurrently herewith:

"VERY SMALL FORM FACTOR CONSUMER ELECTRONIC PRODUCT" by Dabov et. al. filed Aug. 27, 2010 having application Ser. No. 12/870,526; and "ESD PROTECTION IN A VERY SMALL FORM FACTOR CONSUMER ELECTRONIC PRODUCT" by Dabov et. al. filed Apr. 27, 2010 having application Ser. No. 12/870,513 each of which is incorporated by reference in their entireties for all purposes.

FIELD OF THE DESCRIBED EMBODIMENTS

The described embodiments relate generally to consumer electronic products and more particularly to very small media playback device that is highly portable.

DESCRIPTION OF THE RELATED ART

In recent years, small form factor consumer electronic products such as media players and cellular phones have become smaller, lighter and yet more capable by incorporating more powerful operating components into smaller and more densely packed configurations. This reduction in size and increase in density can be attributed in part to the manufacturer's ability to fabricate various operational components such as processors and memory devices in ever smaller sizes while increasing their power and/or operating speed. However, this trend to smaller size and increase in component density and power, however, poses a number of continuing design and assembly challenges.

For example, small form factor consumer electronic products, such as a media player, can require the assembly of a number of components into an enclosure having an extremely small volume. Assembling the various components into the housing having such a small size can require complex, expensive, and time consuming assembly techniques. Moreover, aesthetic considerations can severely restrict the placement, size, and number of components used in the manufacture of the small form factor consumer electronic product. For example, proper alignment of external features such as buttons can be extremely difficult to accomplish when the small size of the consumer electronic device itself can severely reduce the available tolerance stack of the assembled components.

Another challenge to be dealt with concerns proper techniques for mounting structures within the small form factor consumer electronic product. For example, using conventional assembly techniques, various internal components structures can be attached to housing using fasteners such as screws, bolts, rivets, etc and assembled in a sandwich like manner in layer. However, using this technique with small form factor devices can be time consuming, expensive, and prone to error.

In view of the foregoing, due at least to increase component density and reduced size there is a need for improved techniques for inhibiting moisture flow in consumer electronic products.

SUMMARY OF THE DESCRIBED EMBODIMENTS

A very small form factor consumer electronic product includes at least a single piece housing having an integral front and side walls that cooperate to form a cavity in cooperation with a front opening, an edge of the side walls defining a rear opening, wherein at least some of the edges have flanges, wherein at least one of the side walls includes openings sized to accommodate an I/O device. Also included are a clip assembly having a size and shape in accordance with the rear opening, the clip assembly having a plurality of attachment features used to secure the clip assembly to the single piece housing and a plurality of moisture barriers each formed of a moisture resistant material, wherein the plurality of moisture barriers cooperate to inhibit moisture from migrating from an external environment into the cavity. In the described embodiment, at least one of the plurality of moisture barriers is an audio jack assembly electrical moisture barrier. The audio jack assembly electrical contact moisture barrier includes at least an electrical contact having a flat, pad portion and a central upraised portion where the electrical contact integrally formed with an audio jack assembly housing. Also included are a sealing tape layer that is applied to the audio jack assembly housing incorporating the pad portion of the electrical contact leaving the upraised portion exposed, and a flex substrate layer that is electrically connected to the electrical contacts by way of the upraised portion by a solder reflow process. The solder reflow process causes liquid solder to migrate and fill a recessed region between the upraised portion, the sealing tape, and the flex substrate, the solder filled recess region providing a moisture intrusion barrier between the external environment and an interior portion of the very small form factor consumer electronic product.

In another embodiment, a method is described. The method includes at least the following operations. Providing an audio jack assembly, the audio jack assembly includes an audio jack barrel having a size and shape in accordance with an audio post connected to an external circuit, a plurality of electrical contacts integrally formed with the audio jack barrel, the audio jack electrical contacts formed of a flat, pad portion and an upraised portion. The method includes at least applying a layer of sealing tape to the electrical contacts such that the sealing tape forms a layer over the pad portion and leaving the upraised portion exposed, applying a flex substrate onto the sealing tape layer, electrically connecting the flex substrate layer to the electrical contact by way of the upraised portion, wherein the electrical connecting is carried out by performing a solder reflow operation on the audio jack assembly such that solder paste associated with the flex substrate liquefies and flows into a recess portion between the upraised portion of the electrical contact and the sealing tape, wherein when the cured solder forms a water inhibiting seal that essentially prevents moisture passing out of the audio jack barrel.

A moisture inhibiting sealing structure used in an electrical component of an electrical system, the moisture inhibiting seal preventing a flow of moisture from a moisture tolerant portion of the electrical component to a moisture intolerant portion of the electrical system is described. The moisture inhibiting sealing structure includes at least a primary seal structure, the primary seal structure used to provide a first sealing layer, and a finishing seal structure, the finishing seal structure applied to the primary seal structure. The finishing seal structure cooperates with the primary seal structure to prevent the flow of moisture between the moisture tolerant portion of the electrical component and the moisture intolerant portion of the electrical device.

In one aspect, the finishing seal structure is formed during a solder reflow operation.

Other aspects and advantages will become apparent from the following detailed description taken in conjunction with the accompanying drawings which illustrate, by way of example, the principles of the invention.

BRIEF DESCRIPTION OF THE DRAWINGS

The embodiments will be readily understood by the following detailed description in conjunction with the accompanying drawings, wherein like reference numerals designate like structural elements, and in which:

FIGS. 5-7 show various perspective views of representative housing in accordance with the described embodiments.

FIGS. 8-11 show various components of click wheel assembly in accordance with the described embodiments.

DESCRIBED EMBODIMENTS

Figure 1:
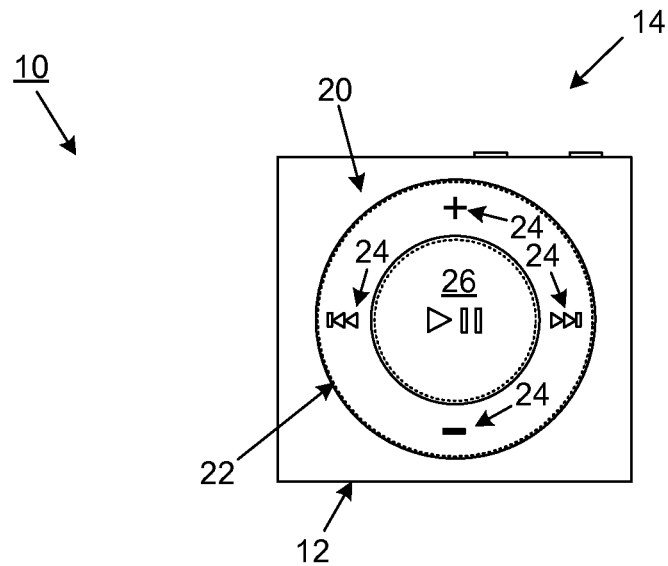
FIG. 1 shows a front view of exemplary very small form factor media player in accordance with the described embodiments

In the following paper, numerous specific details are set forth to provide a thorough understanding of the concepts underlying the described embodiments. It will be apparent, however, to one skilled in the art that the described embodiments may be practiced without some or all of these specific details. In other instances, well known process steps have not been described in detail in order to avoid unnecessarily obscuring the underlying concepts.

This paper discusses an aesthetically pleasing portable computing device and in particular, techniques for inhibiting moisture intrusion into the portable computing device. The portable computing device can have a size and weight allowing the portable computing device to be easily carried about. For the remainder of this discussion and without loss of generality, the portable computing device will be discussed in terms of a very small form factor media player arranged to store a plurality of digital media items any of which can be selected and decoded for play. Due to the small size and light weight, however, any decoded media item signals (such as audio) are not broadcast by way of audio transducers such as speakers. Rather than broadcast the audio signals as sound, the media player can utilize an interface such an audio jack to pass the decoded signals to an external circuit for further processing. For example, when the decoded media file is an audio file, then the decoded audio signal can be passed by way of an audio jack to an external circuit included in or attached to headphones, external speakers, audio recorder, and so forth.

The very small form factor media player can be sized for easy transport in a hand, a pocket, or attached to a lanyard and hung from a neck, wrist, waist, and so forth. Due in part to the small size and lack of available space, the very small form factor media player can have limited functionality. By limited functionality, it is meant that the very small form factor media player can be targeted to perform specific tasks such as store, retrieve and decode a limited number of digital files. Since additional processing of the decoded digital files is likely to be performed outboard of the very small form factor media player, input features used to control operations of the media player can be limited to media file selection, media file decoding, and simple operational parameters such as volume increase/decrease. Therefore, the number and type of input features can be limited as well. For example, selecting of a stored media item (or items) can be performed by a user manipulating a mechanical input along the lines of mechanical button such as a dome switch. The mechanical input can also be used to modify other functions performed by the media player, such as increasing/decreasing volume, fast forwarding/rewinding and so on. In some cases, it can be advantageous to provide specific input features arranged to carry out specific functions. For example, an input feature in the form of a sliding switch can be used to activate a hold, or pause, function whereas a simple feature such as a button can be used to perform a complex operation such as select a playlist (group of associated media items).

The very small form factor media player can include a single piece housing that is seamless in appearance formed of any number of durable materials. In a particular embodiment, the housing can be formed of a conductive material suitable for providing good chassis ground. The housing can therefore be formed of materials such as metal, conductive plastic or conductive composite material. One of the advantages to using metal for the housing is ability of metal to provide good electrical grounding for any internal components requiring a good ground plane. A good ground plane can be used to help mitigate the deleterious effects caused by, for example, electromagnetic interference (EMI) and/or electrostatic discharge (ESD). In a particularly useful configuration, the housing can be formed of from a single billet of metal such as aluminum.

From the single billet of aluminum, the single piece housing can be shaped and sized to accommodate a plurality of internal components. Moreover, due to the single piece construction, various openings in the housing for accommodating various switches, connectors, and so on can be formed without the need to add additional structural support. The aesthetic look and feel of the media player can be substantially enhanced along with the long term resistance to corrosion and scratching by surface treating the aluminum. For example, anodizing the aluminum housing can create a layer on the surface of the aluminum that enhances the luster and sheen of the aluminum housing while simultaneously increasing the resistance to scratches and corrosion.

Simple and efficient design and assembly techniques can be used that facilitate both the aesthetic look and functionality of the very small form factor media player. For example, due to the small size and close proximity of the operational components within the media player, any external moisture that finds its way into the interior of the media player substantially increases the likelihood of damage, either through corrosion or electrical shorts. Minimizing or at least hindering the intrusion of moisture into the interior of the media player can be an important factor in the long term operability of the media player. Therefore, as part of the overall design, a number of moisture/contamination inhibitors can be strategically placed within the media player. The inhibitors can take many forms, such as moisture resistant tape, adhesive, thermoformed plastic caps, and so forth. The inhibitors can include, for example, water resistant membranes along the line of Kapton, Mylar and so forth. The inhibitors can also take the form of a block of compressible and moisture resistant material such as silicone rubber. In the described embodiment, the block shaped moisture inhibitor can have a portion removed to form a slit sized to accept a mechanical arm used to activate a mechanical input such as a switch. In the described embodiment, the mechanical arm can pass through the slit formed in the moisture resistant material effectively isolating that portion of the arm in contact with an active circuit and the exterior portion exposed to the outside environment. In this way, the strategic placement of moisture inhibitors can substantially reduce the risk of moisture entering the interior of the media player and causing corrosion and electrical shorts.

In addition to providing a good moisture inhibitor, in some embodiments, portions of selected moisture inhibitors can be enhanced in such a way that a conduction pathway can be formed. For example, with regards to the silicone rubber moisture inhibitor discussed above, the application of selected dopants (such as small silver spheres), the intrinsic insulation properties of silicone rubber can be modified such that the silicone rubber can become somewhat conductive to the point where a good path to ground can be formed. In this way, not only does the moisture inhibitor substantially hinder the passage of water into the interior of the media player, but also facilitates ESD protection by providing a mechanism for dispersing accumulated charges to a ground plane in the form of the housing.

These and other embodiments are discussed below with reference to FIGS. 1-28. However, those skilled in the art will readily appreciate that the detailed description given herein with respect to these figures is for explanatory purposes only and should not be construed as limiting.

Figure 2:
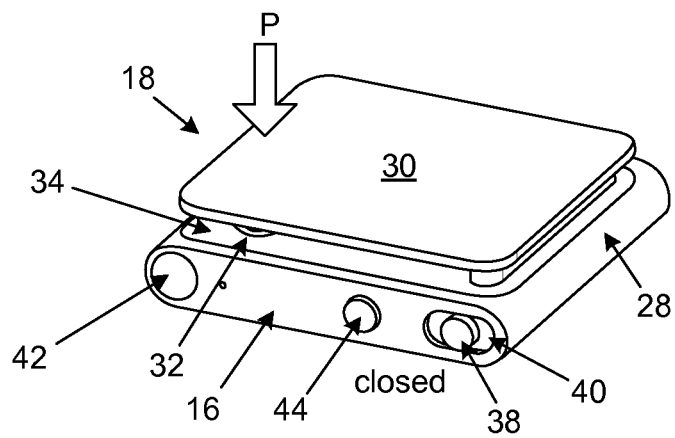
FIG. 2 shows a side view of exemplary very small form factor media player of FIG. 1 with a clip in a closed configuration.
Figure 3:
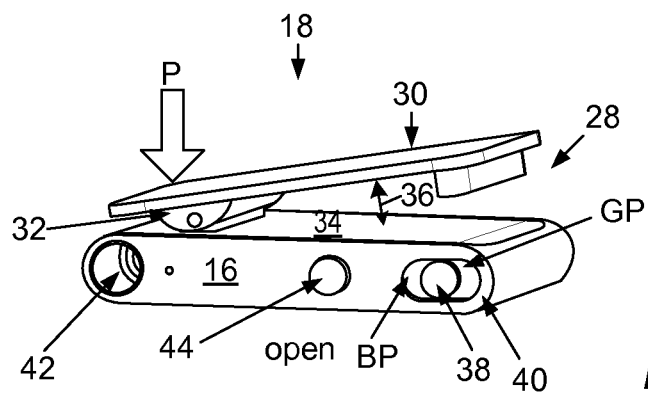
FIG. 3 shows a side view of exemplary very small form factor media player of FIG. 1 with a clip in an open configuration.

Turning first to FIGS. 1-3 showing representative very small form factor media player 10 (hereinafter referred to more simply as media player 10) is shown various perspective views. Media player 10 can process data and more particularly media data such as audio, video, images, and the like. By way of example, media player 10 can generally correspond to a device that can perform as a music player. Media player 10 can have operational components enclosed and supported by housing 12. Media player 10 can have top portion 14, side portion 16, and bottom portion 18. Media player 10 can include one or more input devices. The one or more input devices can include a touch sensitive input device one of which can take the form of a click wheel assembly mounted to a front portion of housing 12 as shown in FIG. 1. The click wheel assembly can include at least click wheel 20. Click wheel 20 can be formed of resilient material such as plastic or metal. Click wheel 20 can have a raised annular portion 22 on which are presented a number of icons 24 each corresponding to a particular button function that can be performed by media player 10 in response to a user touch event. The button functions can include selecting and playing a song, fast forwarding or fast rewinding through a song, increasing/decreasing volume and the like. In the described embodiments, the various button functions can be implemented via a mechanical clicking action.

In order to convert the user touch event to a signal that can be processed and acted upon by media player 10, each icon 24 can be associated with a sensor arrangement (described below). When pressure is applied to a particular icon, the associated portion of click wheel 20 can respond by mechanically engaging a corresponding one of a plurality of sensors. In the simplest case, an electrical signal is produced each time a sensor is engaged. In most cases, the signals are monitored by an electronic interface that converts the signal into information. This information can then be used by media player 10 to perform a desired control function. Click wheel 20 can also include center button 26. Center button 26 can be formed of plastic or metal. When pressure is applied to center button 26, a signal can be generated that can cause media player 10 to execute a pre-determined function. For example, when pressure is applied to center button 26, a signal can be generated and forwarded to processing circuitry that can cause media player 10 to start or stop the playing of a media item. It should be noted that the shape of click wheel 20 can also be widely varied. For example, click wheel 20 can be circular, rectangular, square, oval, triangular, and the like.

Bottom portion 18 can include clip assembly 28 that can have a closed configuration as shown in FIG. 2 and an open configuration as shown in FIG. 3. Clip assembly 28 can be used to secure media player 10 to external features such as clothing, lanyards and the like. Clip assembly 28 can include clip 30 integrally formed with torsion spring block 32 that includes a torsion spring, torsion spring block 32 being attached clip plate 34 (also referred to as door 34). Clip plate 34 can include various attachment features (not shown), both hooking and latching type that can be used to attach clip assembly 28 to housing 12 and fully enclose the internal components of media player 10. In order to securely attach media player 10 to an object using clip assembly 28, pressure P can be applied to clip 30 at about torsion block 32 causing clip 30 to pivot away from clip plate 34 causing clip assembly 28 to transition from the closed configuration of FIG. 2 to the open configuration of FIG. 3. In this way, gap 36 can be formed between clip plate 34 and clip 30 of sufficient size to accommodate an object or a portion of an object such as a shirt sleeve, lapel, lanyard and so forth. Therefore, by removing pressure P from being applied to clip 30, the spring force created by the torsion spring in torsion spring block 32 can cause clip 30 to engage the object when clip assembly 28 moves back to the closed configuration. In this way clip 30 can grasp and secure the object without damage to either the object or media player 10 thereby easily securing media player 10 to objects such as clothing, lanyards and so forth.

Media player 10 can also include one or more switches such as play switches, hold switches, and the like that are accessible through various openings in housing 12. For example, hold switch button 38 can be used to activate or deactivate click wheel 20. This is generally done to prevent unwanted commands being generated by click wheel 20, as for example, when media player 10 is stored inside a user's pocket. Hold switch button 38 can take many forms such as a two, three or more position button. For example, when configured as a three position switch as shown in FIGS. 2 and 3, hold switch button 38 can have a first, second and third position relative to housing 12. In order to provide the user with a quick and unambiguous indication of the position of hold switch button 38, label 40 can be provided. Label 40 can provide distinctive visual indicia (such as different colored portions as shown in FIGS. 2 and 3 in the form of green portion GP and blue portion BP) to indicate the position of hold switch button 38. For example, in position two (corresponding to a central positioning of hold switch button 38), label 40 can unambiguously indicate that hold switch button 38 has been placed in position two by concurrently presenting both green portion GP and blue portion BP of label 40. In order to remain clear and distinct over an expected operating life of media player 10, label 40 can be formed of resilient material such as metal.

Media player 10 can include audio jack port 42. Audio jack port 42 can mechanically and electrically couple media player 10 to an external circuit whereby audio information can be outputted from media player 10 and data imported to media player 10. In some cases, power can also be transferred to media player 10 by way of circuitry associated with audio jack port 42. Audio jack port 42 can receive a post (not shown) that can facilitate the transfer of information (or power) between media player 10 and external circuits. For example, audio signals from decoded digital audio files can be passed to external audio rendering devices, such as headphones, speakers, etc. In order to minimize the number and complexity of mechanical input assemblies required to operate media player 10, a number of multi-function mechanical inputs can be provided. For example, playlist button 44 can be used to activate a complex function such as selecting a playlist of media items for play by media player 10. As well known in the art, the playlist is a collection of media items such as songs that have been chosen to be played one at a time as a group. Therefore, any songs identified as belonging to a particular playlist can be selected, decoded, and played by simply depressing playlist button 44. In this way, any need for complex user interaction, such as scrolling can be eliminated thereby rendering media player 10 simple in design and easy to operate.

Figure 4:
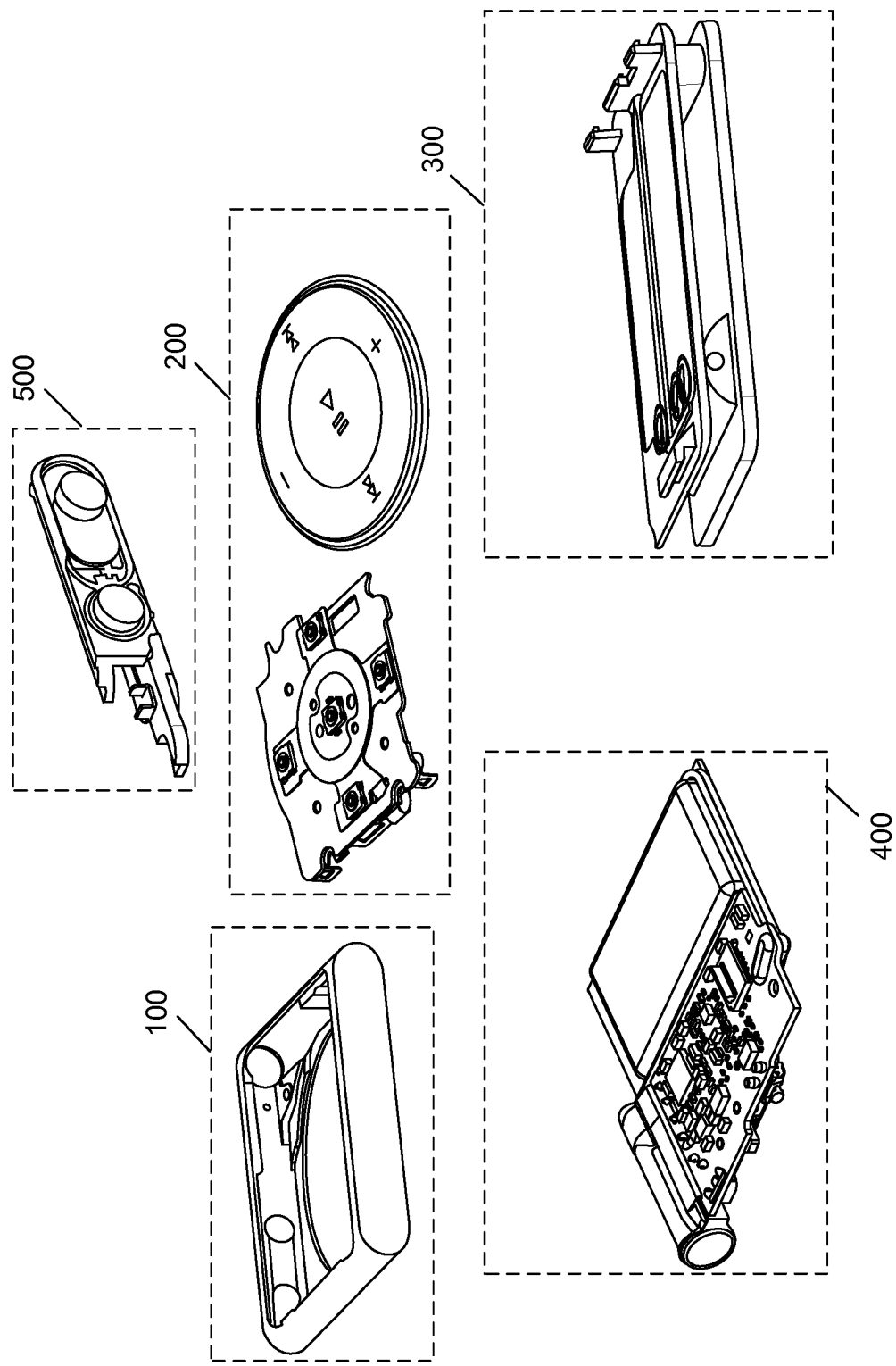
FIG. 4 is an exploded view showing various sub-assemblies of components used in the fabrication of media player 10.

FIG. 4 is an exploded view showing various sub-assemblies of components used in the fabrication of media player 10. The sub-assemblies can include housing 100, click wheel assembly 200; clip assembly 300, main logic board (MLB) assembly 400, and hold switch assembly 500 each described in more detail below.

Figure 5:
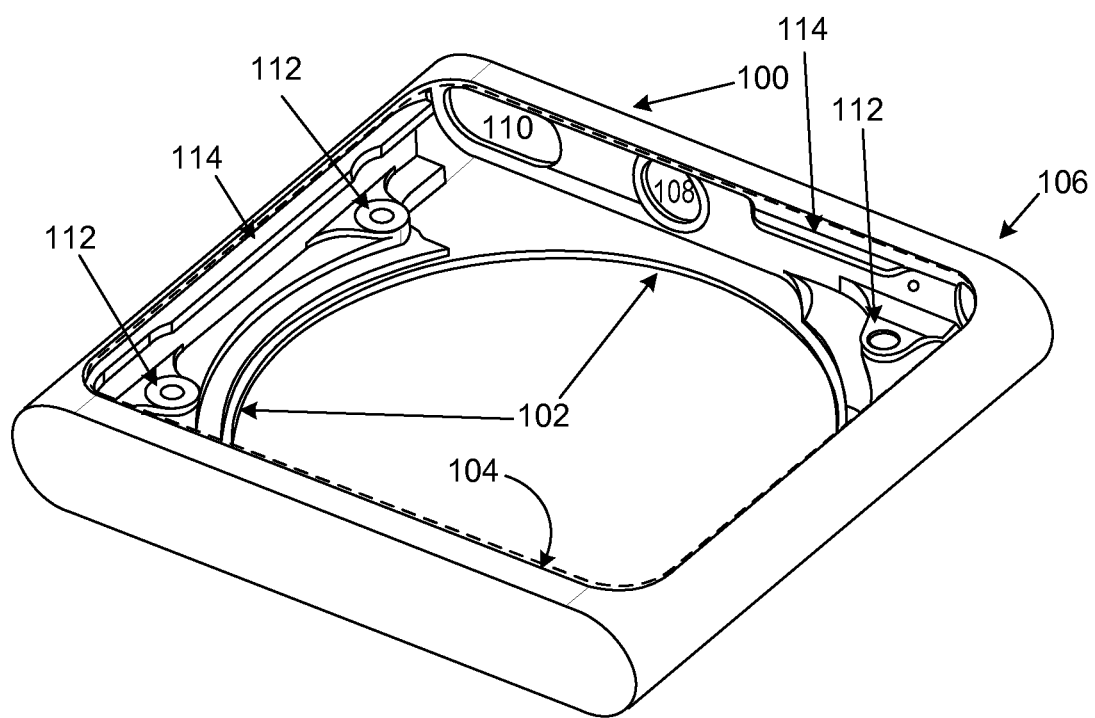

A first perspective view of an embodiment of housing 12 shown in FIG. 5 as housing 100 can be formed of any number of materials such as plastic or metal which can be forged, molded, or otherwise processed into a desired shape. In those cases where media player 10 has a metal housing and incorporates RF based functionality, it may be advantageous to provide at least a portion of housing 100 in the form of radio (or RF) transparent materials such as ceramic, or plastic. In any case, housing 100 can be configured to at least partially enclose any suitable number of internal components associated with media player 10. Housing 100 can enclose and support internally various structural and electrical components (including integrated circuit chips and other circuitry) to provide computing operations for media player 10. The integrated circuits can take the form of chips, chip sets, modules any of which can be surface mounted to a printed circuit board, or PCB, or other support structure.

Housing 100 is thus effectively a chassis or "exoskeleton" for the overall device that contains the device components and can also serve as a starting point for assembling the entire device. Housing 100 can also include various openings some of which can be used to install an insert containing various internal components, as well as buttons, ports, an audio jack, and the like, as set forth below. For example, front opening 102 can be sized to receive click wheel assembly 200 whereas rear opening 104 can accommodate clip assembly 300. Opening 106 (shown more clearly in FIGS. 6 and 7 each of which provide second and third perspective views, respectively, of housing 100) can be sized to accept audio jack port 42 whereas opening 108 can accept playlist button 44 while opening 110 can accept hold switch button 38. Securing features 112 can be used to assist in securing internal components to housing 12 using a fastener such as a screw. Flanges 114 can support a moisture inhibiting seal arranged to at least inhibit the intrusion of moisture into the interior of media player 10.

When housing 100 is formed of a good conductor, such as aluminum, housing 100 can function as a chassis ground that provides a good ground plane for internal electrical components. In addition to providing a good ground plane for internal electrical components, the metallic nature of housing 100 can help prevent static electrical charge from accumulating thereby reducing the possibility of an electrostatic discharge damaging sensitive electrical components. However, in order to improve the aesthetic look of housing 100, a substantially non-conductive surface layer can be formed on housing 100. This surface layer can provide excellent corrosion and scratch protection but can nonetheless prevent good electrical contact to the underlying metal. For example, in the case where housing 100 is formed of aluminum, an anodizing process can cause a layer to form on the surface of housing 100 (both interior and exterior surfaces). This layer can prevent a good electrical contact to the underlying base aluminum severely degrading the ability of housing 100 to provide a chassis ground. A good electrical contact to the underlying aluminum base layer can be achieved by selectively removing at least portion 116 of the protective layer from interior surface 118 of housing 100 as shown in FIG. 7.

FIGS. 8 through 11 show the components and the relationship between the components of click wheel assembly 200. It should be noted that click wheel assembly 200 is self contained in that once fully assembled, click wheel assembly 200 is fully functional and capable of being function tested prior to incorporation into media player 10. Turning first to FIG. 8 click wheel assembly 200 can include button ring assembly 202. Button ring assembly 202 can include click wheel 20 (described above) and membrane 204 that can be attached to an inside portion of click wheel 20 by way of adhesive. Shown in more detail in FIG. 9, membrane 204 can be formed of a resilient material such as silicone rubber. Membrane 204 can be sized to fully accommodate click wheel 20. For example, click wheel 20 can be placed entirely within and on membrane 204 in such a way that raised perimeter portion 206 of membrane 204 can engage outer edge 208 of click wheel 20 forming a tight seal between click wheel 20 and membrane 204 when top surface 210 of membrane 204 is attached to click wheel 20 using, for example, adhesive. In this way, button ring assembly 202 can be considered a single sealed sub-assembly. Prior to membrane 204 being attached to click wheel 20, shims 212 can be placed within recesses 214 associated with each icon 24 in annular region 22 and center button 26 of click wheel 20. Shims 212 can be used to adjust the mechanical response of click wheel 20 to a touch event by a user. Shims 212 can adjust a distance by which click wheel 20 moves in response to the touch event at a particular one of icons 24 or center button 26. In this way, the subjective feel click wheel 20 can be modified as needed.

Figure 10:
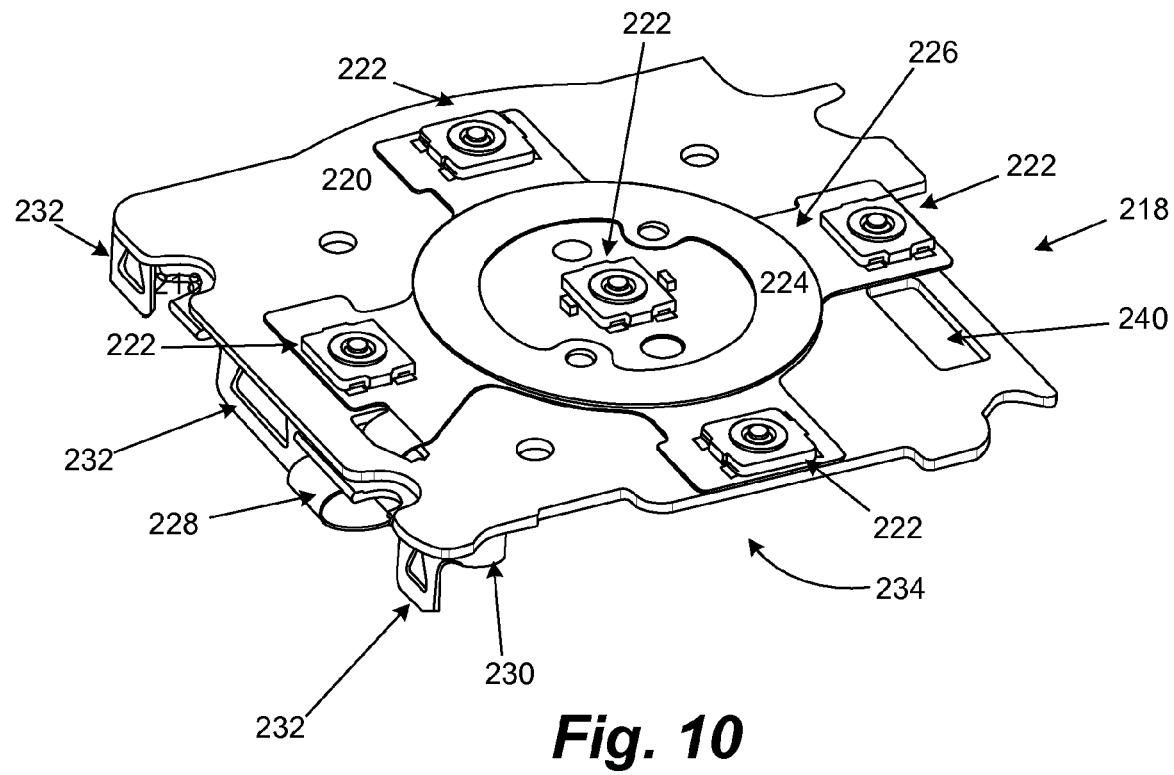
Figure 11:
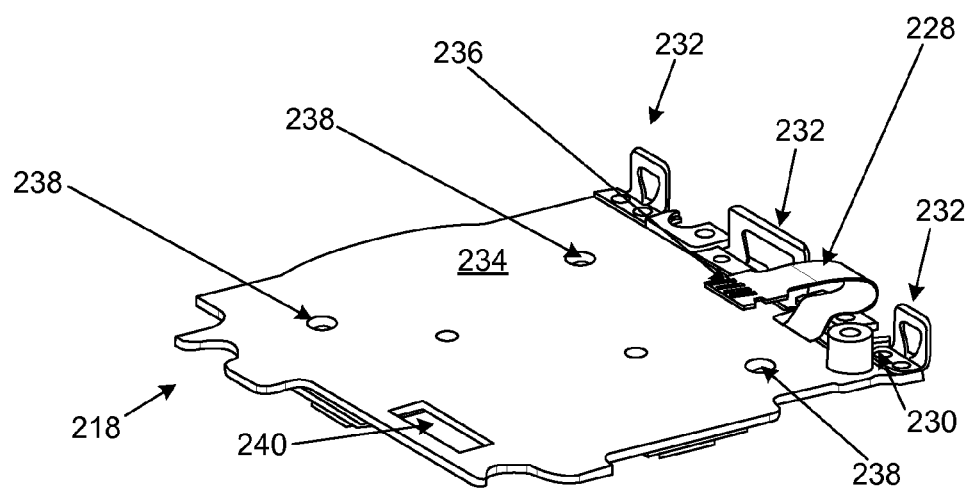

FIG. 10 shows representative button plate 218 in accordance with the described embodiments. Surface 216 of membrane 204 can be used to secure button ring assembly 202 to button plate 218. Button plate 218 can be formed of strong and resilient material such as metal or any suitable composite material. In the embodiments described herein, however, button plate 202 will be considered to be formed of metal without loss of generality. Accordingly, metal button plate 218 can be formed of metals such as stainless steel and aluminum. Metal button plate 218 can be attached to button ring assembly 202 by attaching surface 216 of membrane 204 to surface 220 of metal button plate 218 using any suitable adhesive such as dual sided adhesive tape. Surface 220 of metal button plate 218 can include sensors 222 associated with a corresponding one of icons 24 and 26. As described above, when pressure is applied to click wheel 20 in proximity to icons 24 or 26, the corresponding sensor 222 can respond to the applied pressure by generating a signal that can be used by control circuitry to modify operations of media player 10.

In the described embodiment, sensors 222 can take the form of mechanical switches such as dome buttons 222 (also referred to as tact switch, short for tactile switch). The number of placement of dome buttons 222 can be widely varied. For example, anti-rotation ring 224 can be placed in such a way as to prevent rotation of click wheel 20 surrounding dome button 222 associated with central button 26. In the particular embodiment shown, dome buttons 222 form an array of five switches connected to click wheel flex 226 each of which align with an associated one of icons 24 and 26 on click wheel 20. Click wheel flex 226 can include connector flex 228 that can be used to electrically connect click wheel assembly 200 to operational circuits within media player 10. In particular, connector flex 228 can be connected to a main logic board, or MLB, using a zero insertion force (ZIF) connection described and shown below.

Metal button plate 218 can include metal boss 230 welded to downward facing surface 234. Metal boss 230 can be used to attach metal button plate 218 (along with click wheel assembly 200) to internal components such as a printed circuit board, or PCB. Tabs 232 can be used to secure click wheel assembly 200 to clip assembly 300 during an assembly operation. For example, clip assembly 200 can be latched to metal button plate 218 using tabs 232. In this way, button metal plate 218 can be considered dual use in that surface 220 of metal button plate 218 can be used to support button ring assembly 202 whereas surface 234 shown in FIG. 11 can be used to support components such as a printed circuit board by way of welded metal boss 230 and clip assembly 300 by way of tabs 232. Connector 236 can be used to electrically connect flex connector 228 to electrical components such as the MLB. Moreover, openings 238 align with openings 112 formed in housing 100. In this way, a fastener can be used to secure at least metal button plate 234 directly to housing 100.

Figure 12:
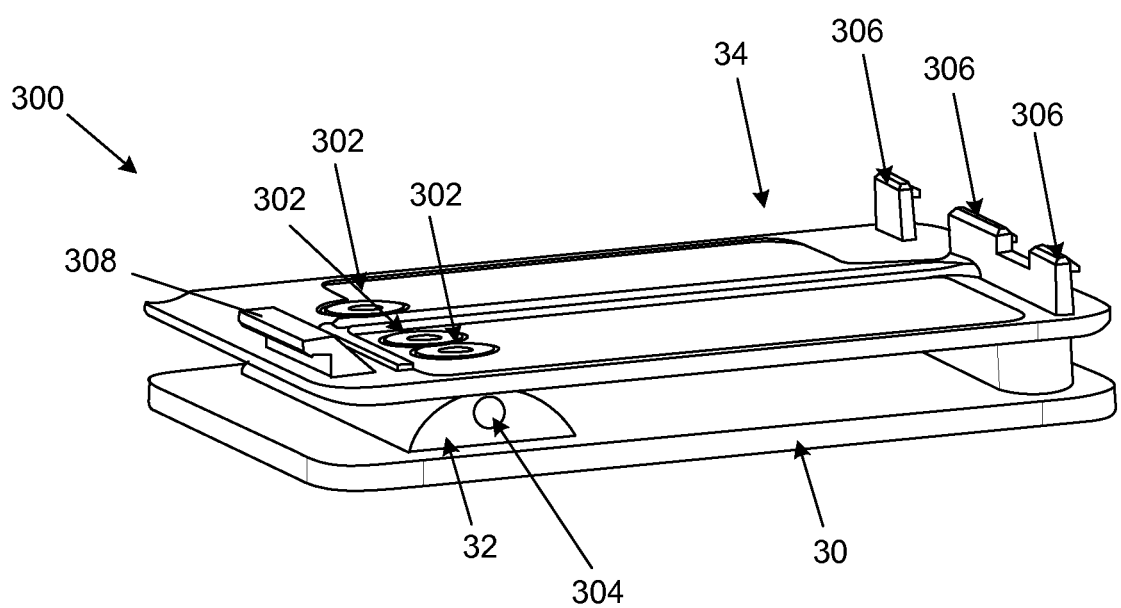
FIG. 12 shows representative clip assembly in accordance with the described embodiments.

FIG. 12 shows an embodiment of clip assembly 300. Clip assembly 300 can be pre-assembled and tested prior to being used to complete assembly of media player 10. Clip assembly 300 can be pre-assembled using fasteners 302. Fasteners 302 can take the form of screws 302. Screws 302 can be used to mount clip door 34 to torsion block 32 that houses torsion spring 304. Torsion spring 304 can keep clip 30 in tension against clip door 34 in the closed configuration. Clip assembly 300 can be attached to metal button plate 218 by way of hooking features 306 that engage with tabs 232 on metal button plate 218. Attachment feature 308 can take the form of a hook that can engage opening 240 formed in metal button plate 218.

Figure 13:
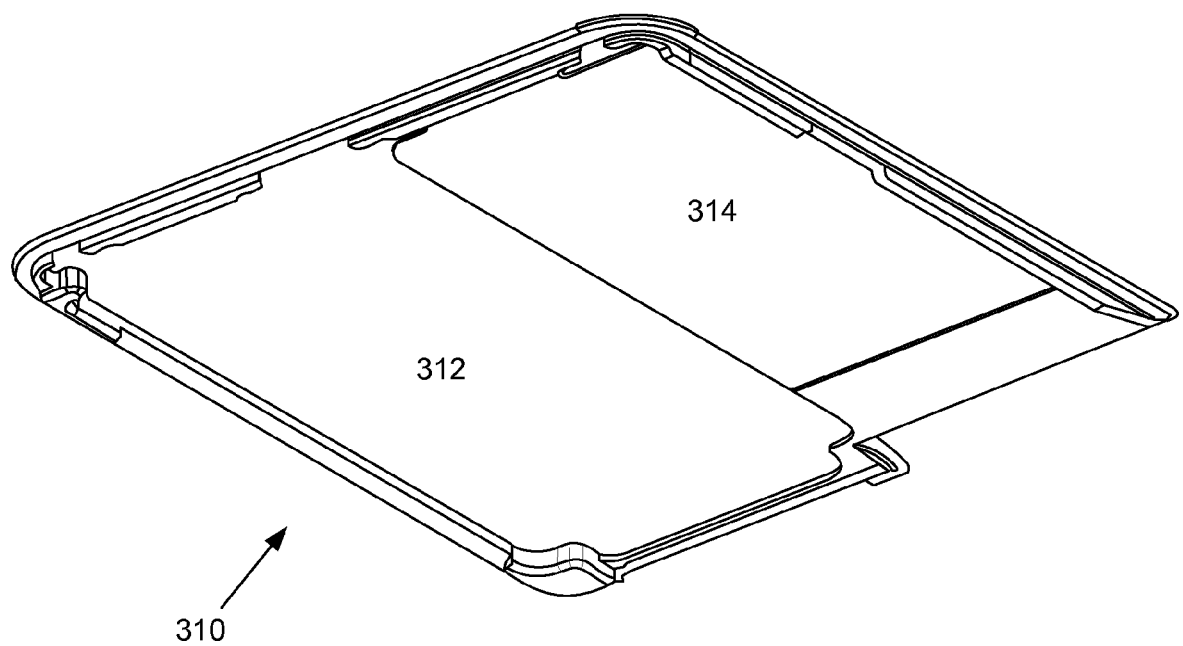
FIG. 13 show representative click assembly seal in accordance with an embodiment.

As shown in FIG. 13, seal 310 can be formed of moisture inhibiting material such as silicone rubber. Seal 310 can be shaped to conform to opening 106 of housing 100 in proximity to flanges 114 formed with opening 106. Seal 310 can be placed on housing 100 in proximity to flanges 306. In this way, seal 310 can inhibit the intrusion of moisture or other liquids from the external environment to an interior portion of housing 100. This is particularly important due to the presence of various openings within housing 100 each of which presents a potential moisture intrusion pathway.

Seal 310 can be sized and shaped in accordance with housing 100 and in particular opening 106. Seal 310 can be shaped to inhibit moisture intrusion into the interior of housing 100 and in particular those portions of housing 100 that have openings for input devices such as buttons or switches that are exposed to the external environment. For example, opening 312 in seal 310 can correspond to a battery used to provide power to media player 10. Opening 314 can on the other hand correspond to a main logic board, or MLB, juxtaposed to the battery. Since the MLB includes a number of electrical components that are likely to be moisture intolerant, portion 314 can be configured to provide a more robust barrier to the intrusion of moisture than that provided by portion 312.

During assembly of media player 10, seal 310 can be placed directly onto flanges 114 of housing 100. Once in place, clip assembly 300 can be directly placed on seal 310 and pressure applied to clip assembly 300. The pressure applied to clip assembly 310 can cause hooks 306 to engage tabs 224 of metal button plate 218 and attachment feature 308 to engage opening 240. In this way, click wheel assembly 200 and clip assembly 300 can be securely attached to each other in such a way to minimize the intrusion of moisture to the interior of media player 10. By foregoing the requirements to use fasteners such as screws to mount clip assembly 300 to housing 100, there are no visible fasteners providing media player 10 with a clean and efficient appearance.

Due to the small size and compact nature of media player 10, the effects of moisture intruding into media player 10 can have serious consequences. For example, due in part to the high packing density of internal components within media player 10, even a small amount of moisture can cause a leakage path between components resulting in reduced functionality or even damage. This is especially true since there is little unused space within media player 10 resulting in a much higher probability of moisture induced damage. In addition to damage potentially caused by moisture intrusion, damage from electrostatic discharge, or ESD, can be severe. Again, due to the small size and tight geometries, electric fields strength can become so high that considerable voltage spikes are possible. This is particularly true when considering the close proximity of sensitive components in the MLB and external switches such as playlist button 44 and hold button 38. A user merely engaging a switch or even just picking up media player 10 could easily be responsible for an electrostatic discharge having the potential for electrically damaging any number of sensitive electrical components. Accordingly, ESD protection and the inhibition of moisture/contamination intrusion are important considerations in the design and layout of media player 10.

Figure 14:
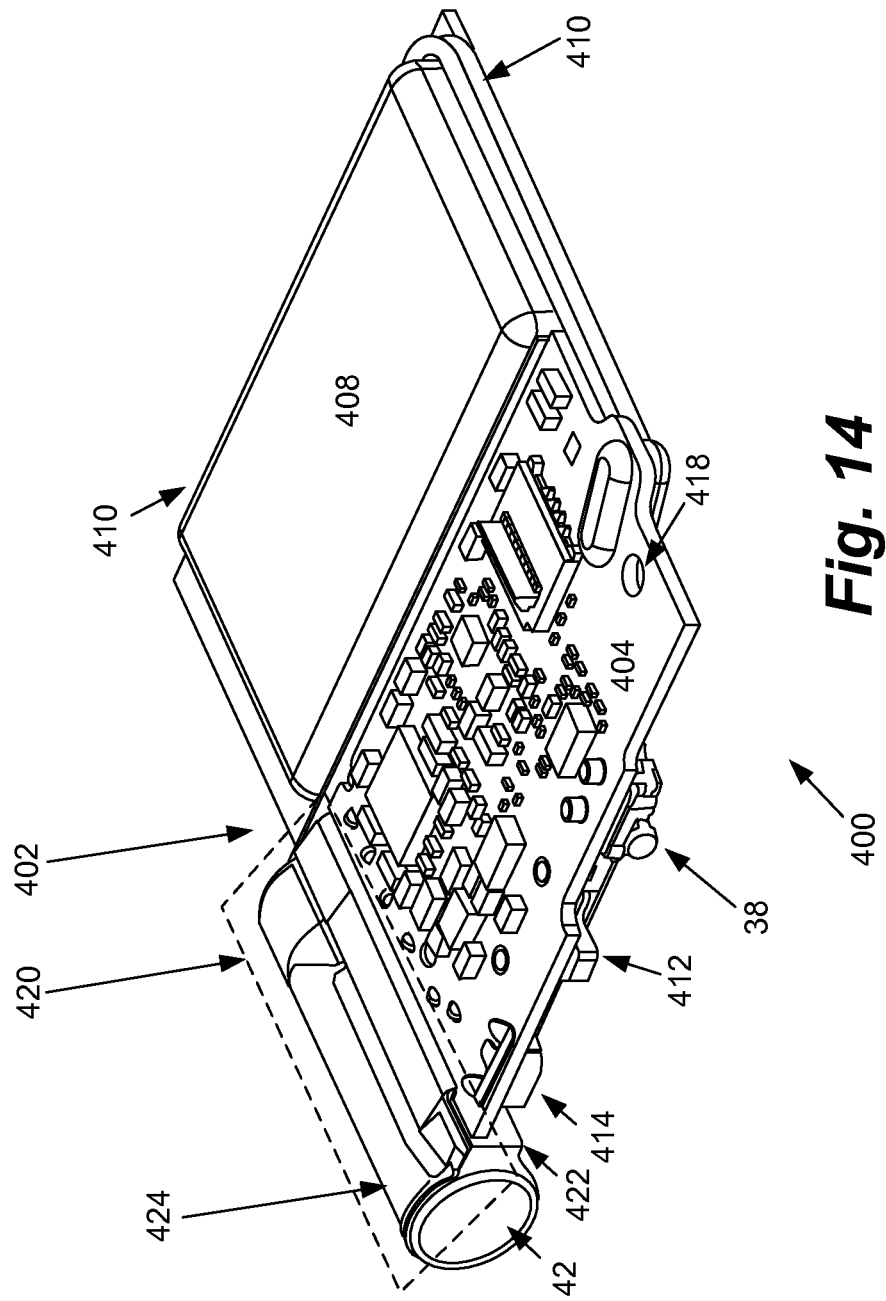
FIG. 14 shows main logic board (MLB) assembly in accordance with an embodiment.

FIG. 14 shows main logic board (MLB) assembly 400 in accordance with an embodiment. MLB assembly 400 can include MLB 402. MLB 402 can include printed circuit board (PCB) 404 onto which are mounted and electrically connected a plurality of integrated circuits 406. The integrated circuits can include at least a microprocessor, semi-conductor (such as FLASH) memory, various support circuits and so on. Power can be supplied to the integrated circuits by battery 408 connected to PCB 404 by way of electrical connectors 410. Battery 408 can be a lithium ion type battery. Playlist tact switch 412 and "side firing" hold tact switch 414 are also shown. It should be noted that the term "side firing" is meant to convey the idea that due in part to layout considerations and component density, hold switch 38 can be displaced from the position of hold tact switch 414. In this way, an armature (described in more detail below) can connect hold switch 38 and hold tact switch 414. Connector 416 can connect to flex connector 228 at contacts 236. In one embodiment, connector 416 can be a zero insertion force, or ZIF, connector well known in the arts. Opening 418 can align with welded metal boss 230 and be sized to accept a fastener such as a screw that can be used to secure MLB assembly 400 to click wheel assembly 200. In this way, the fastener can securely join MLB assembly 400 and click wheel assembly 200.

Figure 15A:
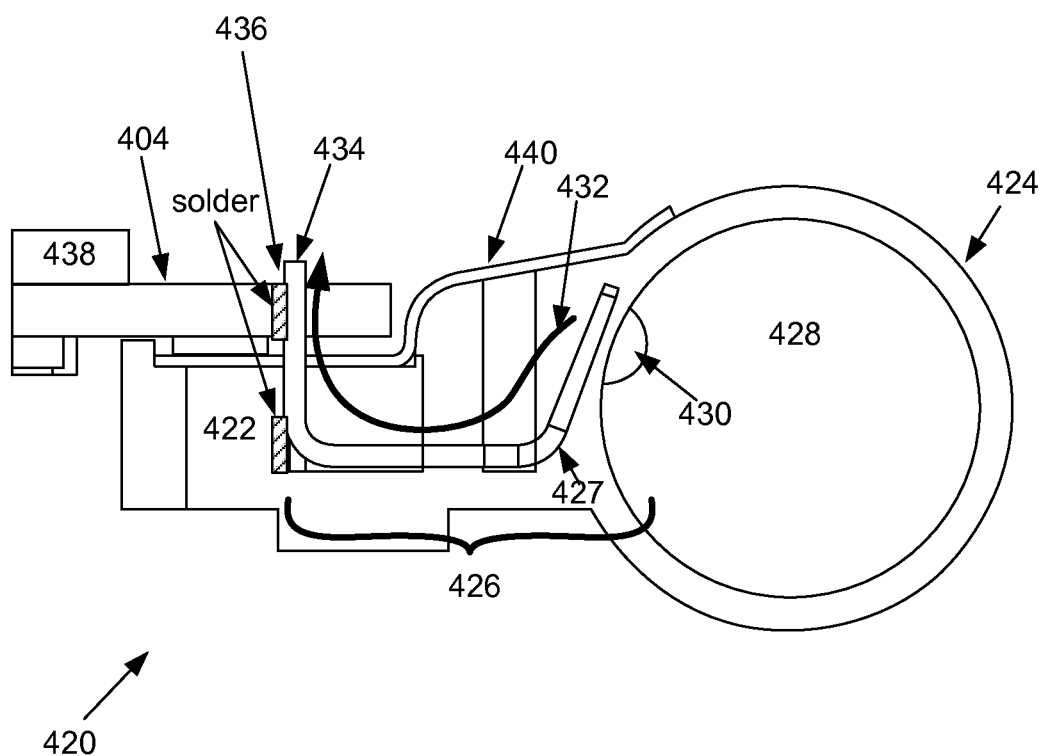
FIGS. 15-17 show perspective views of an audio jack assembly in accordance with the described embodiments.
Figure 15B:
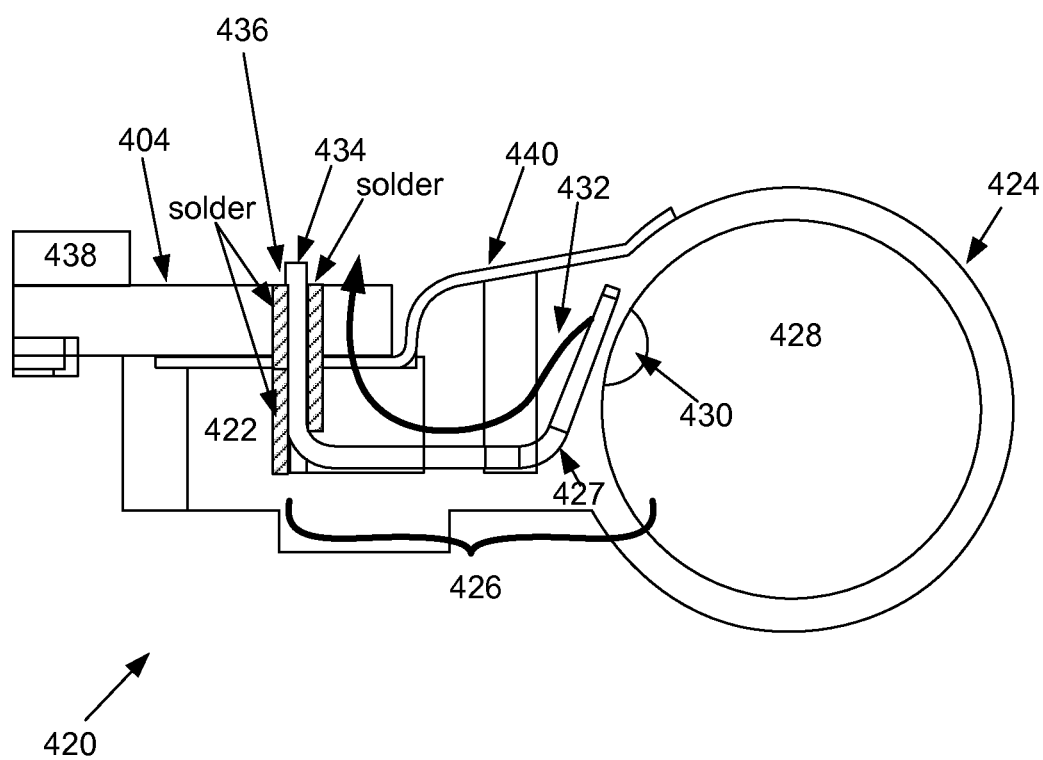
Figure 16:
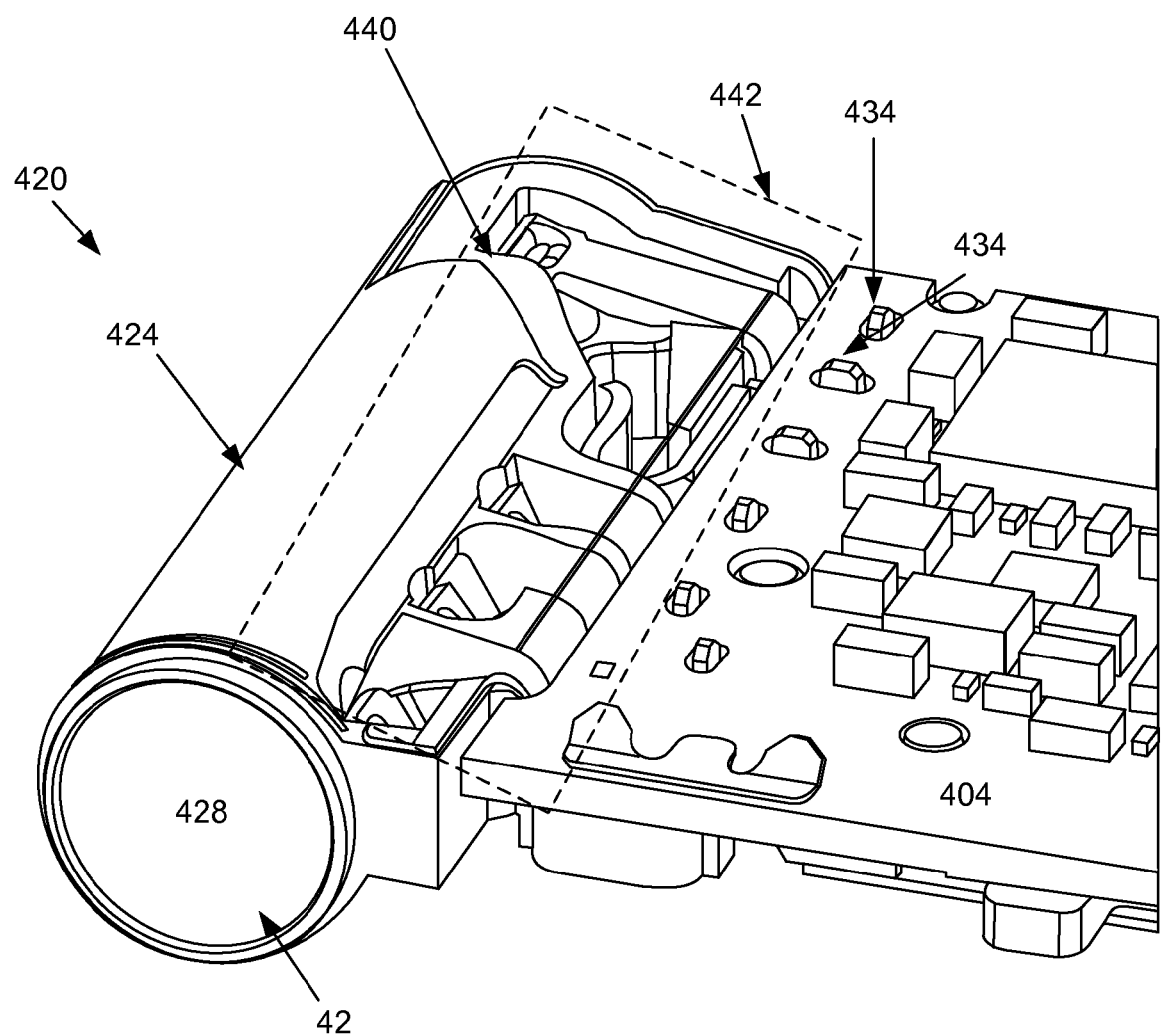

MLB 402 can include audio jack assembly 420 that can be surface mounted onto PCB 404 by way of audio jack body 422. Audio jack assembly 420 can include audio jack barrel 424 integrally formed with audio jack body 422 each being suitably sized and positioned on PCB 404 to align with opening 106 in housing 100. In this way audio jack barrel 424 can receive an audio jack post by way of audio jack port 42, the audio jack post having electrical contacts that align with and electrically connect with an exposed portion of audio jack contacts 426 described and shown in more detail in FIGS. 15 and 16. More specifically, FIG. 15 shows a side view of audio jack assembly 420 illustrating the relative position of audio jack contacts 426 with respect to audio jack barrel 424, audio jack body 422, and PCB 404. In the described embodiments, audio jack contacts 426 can include portion 427 embedded within audio jack body 422. However, in order to make good electrical contact with corresponding electrical contacts on an audio jack post that is inserted into audio jack port 42 a portion of audio jack contacts 426 can be exposed to interior 428 of audio jack barrel 424 as audio jack pads 430.

It should be noted that interior volume 428 can be directly exposed to the external environment, an environment that can include substantial amounts of contaminants and moisture. Therefore any path between interior volume 428 and the interior of media player 10 that could potentially allow the passage of the contaminants and moisture must be carefully considered. Accordingly, path 432 can be considered to be a potential flow path between contact post 434 placed through PCB opening 436 used to connect audio jack pads 430 to circuitry 438 surface mounted to PCB 404.

In order to prevent, or at least minimize the potential for the intrusion of contaminants and moisture from interior volume 428, a moisture inhibitor can be used to severely restrict if not entirely stop any direct flow of contaminants and/or moisture along path 432. The moisture inhibitor can include more than one component. For example, in order to restrict or eliminate the possibility of passage of moisture or contaminants to the interior of media player 10 along path 432, a number of moisture flow inhibitors can be incorporated within path 432. In one embodiment, PCB opening 436 can be filled with solder during a surface mounting procedure used to electrically connect post 434 to electrical traces on PCB 404. As part of a standard assembly procedure, PCB 404 can undergo a wave solder process whereby solder is flowed over the surface of PCB 404. The flow of solder can fill in PCB opening 436 by way of a wicking action. The wicking action can have the effect of sealing any gaps that may exist at an interface of PCB 404 and connect post 434 as well as between audio jack body 422 and connect post 434.

In place of or in addition to the solder, other moisture inhibitors that can be incorporated into path 432 can include at least layer 440. Layer 440 can be formed of material well suited to inhibit the flow of moisture or contaminants. Layer 440 can, for example, take the form of a thin film or tape such as Kapton and Mylar that can conform to the external shape of audio jack barrel 424 and audio jack body 422. For example, moisture flow inhibiting film 440 can be placed in direct contact with audio jack body 422 and audio jack barrel 424 extending to a region that covers contact holder area 442 shown in more detail in FIG. 16. In some cases, adhesive material may be required to assure that film 440 substantially conforms to the shape of audio jack barrel 424 and audio jack body 422. For example, an adhesive layer can be placed on top of film 440 forcing film 440 to conform to the surface features of audio jack barrel 424 and audio jack body 422. Placing adhesive on top of film 440 can be particularly advantageous when film 440 is thin and likely to wrinkle. Any gaps between film 440 and audio jack body 422 and audio jack barrel 424 can themselves present additional pathways for moisture/contaminant intrusion in the interior of media player 10. In order to assure full compliance and maximize the inhibition of the flow of moisture and contaminants into the interior of media player 10, contact post 434 can pass through film 440 further inhibiting the flow of moisture/contaminants between interior 428 and the interior of media player 10.

Figure 17:
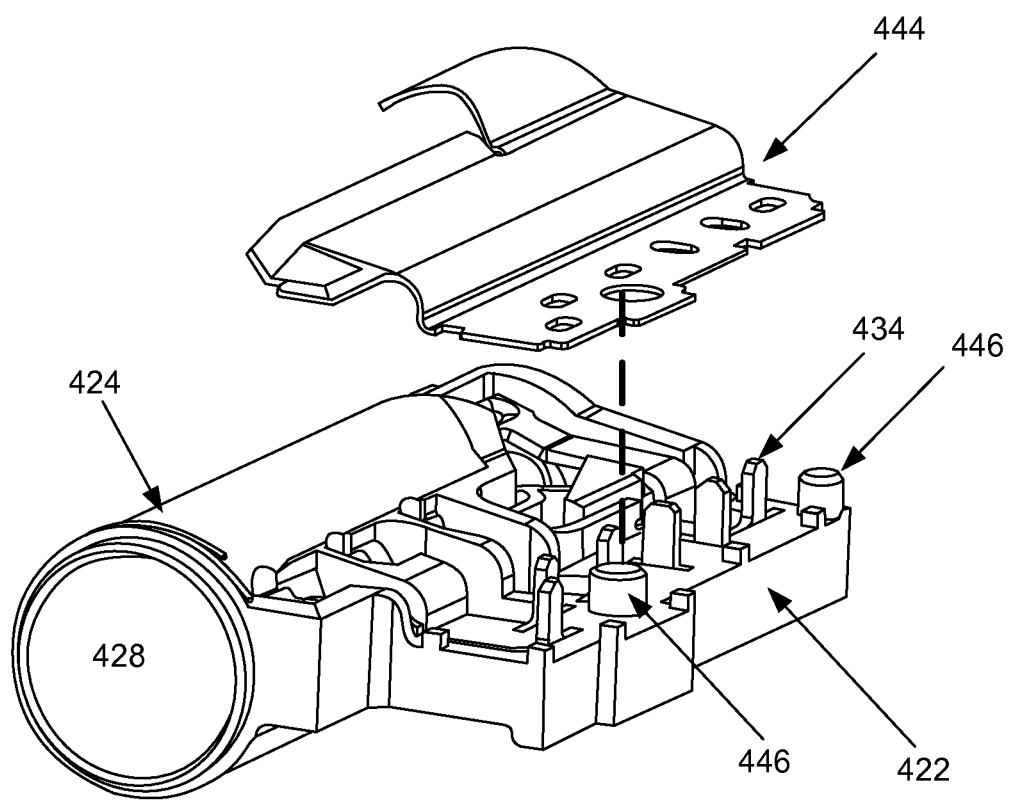

In another embodiment, the moisture flow inhibitor can take the form of structures such as cap 444 that can be mounted directly to audio jack assembly 420 as shown in FIG. 17. Cap 444 can be formed of moisture resistant material that can be formed by a thermoforming process to have a shape that conforms to that of audio jack assembly 420. In particular, cap 444 can include openings sized and placed to accommodate contact post 434 and mounting posts 446 used to attach audio jack assembly 420 to PCB 404. In some cases, it may be advantageous to secure cap 444 to audio jack assembly 420 using adhesive. Cap 444 can be placed and secured during the assembly process. Since cap 444 has been shaped to conform to the contours of audio jack assembly 420, the likelihood of gaps between cap 444 and audio jack body 422 and audio jack barrel 412 can be practically eliminated. In this way, any anti-wrinkling procedures needed when film 440 is used are not necessary with the use of cap 444.

In order to monitor whether or not the interior of media player 10 has been exposed to moisture, a number of moisture indicators can be placed within the interior of media player 10. One of the most common moisture indicators provides a visual indication, generally by changing colors (e.g., from white to red) when moisture comes into contact with it. The visual indication can be viewed through a viewing port structure. In this way, any moisture intrusion can be readily identified. Due to the direct exposure of audio jack interior 428 to the external environment, there is a possibility that moisture within audio jack interior 428 can intrude into the interior of media player 10 if not by path 432 but by other moisture intrusion paths. Therefore, determining the path that any moisture within interior of media player 10 took from the external environment can represent significant data both for design purposes as well as customer service and relations. Any abusive behavior can have the effect of rendering any manufacturer warranty invalid. For example, if there is an indication that moisture has penetrated the interior of media player 10, then a reasonable conclusion is that media player 10 was exposed to an environment having a high concentration of moisture such as a lake, pool, or stream. In this way, a warranty condition may have been violated having the possibility of an uncovered repair expense.

A moisture detection system can be provided to determine if moisture has intruded into the interior of media player 10. It should be noted, however, that it is expected and anticipated that moisture will be present at audio jack interior 428. Therefore, the moisture detection system described herein must distinguish between the expected presence of moisture within audio jack interior 418 and moisture that has penetrated into the interior of media player 10.

Figure 18:
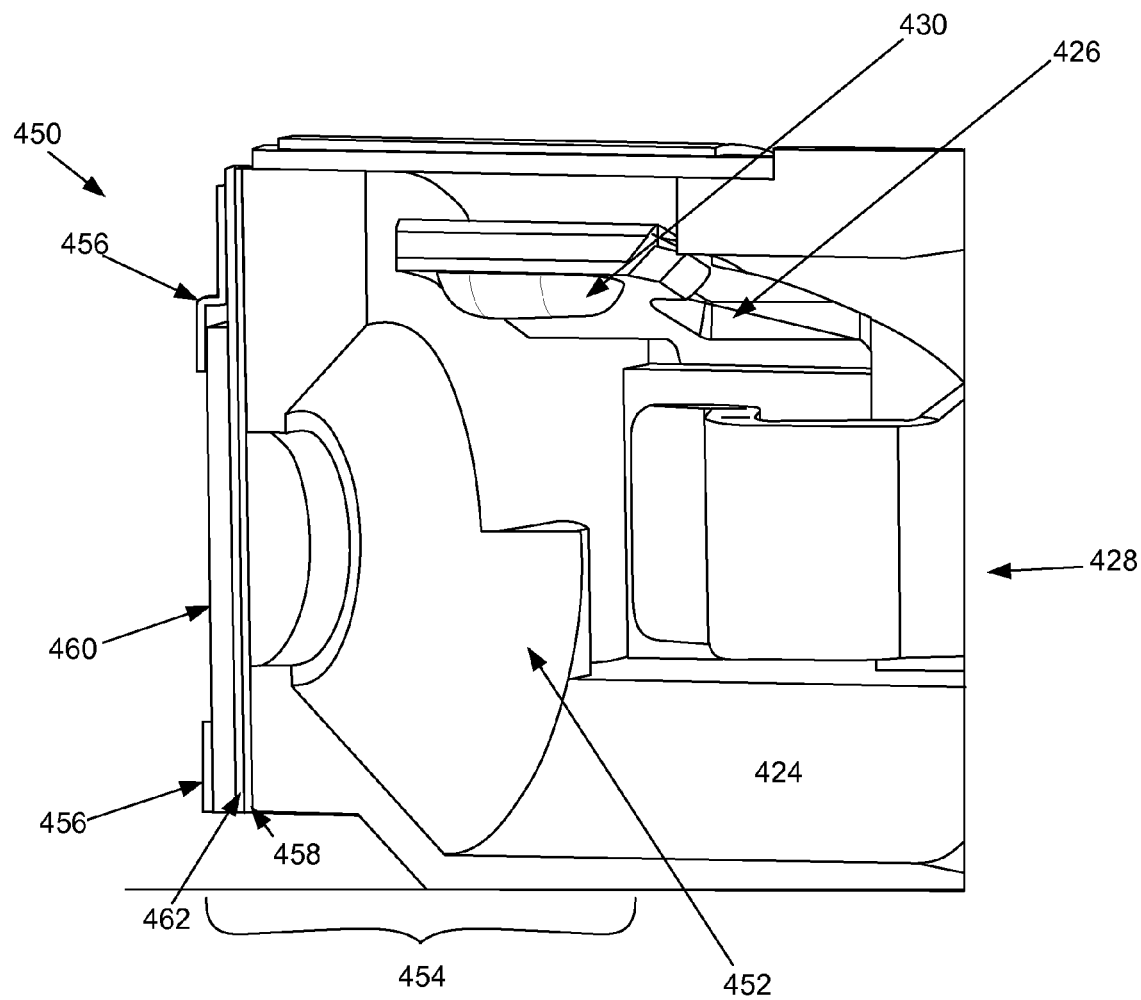
FIGS. 18-19 show interior moisture detection system in accordance with the described embodiments.

FIG. 18 illustrates moisture detection system 450 in accordance with the described embodiments. Moisture detection system 450 can be located within the interior of media player 10. Moisture detection system 450 can provide a visual indication, generally by changing colors (e.g., from white to red) when moisture comes into contact with a moisture detecting layer indicating that moisture has penetrated into the interior of media player 10. Moisture detection system 450 can be connected to viewing port 452 located at end 454 of audio jack barrel 422 by an adhesive layer (not shown). The adhesive layer can be of any suitable adhesive material such as two-sided pressure sensitive adhesive film (double sided tape), an adhesive without film backing etc. Moisture detection system 450 can include frame 456 connected to viewing port structure 452.

Moisture detection system 450 can include a number of layers such as wicking layer 458 and dyeing layer 460. Wicking layer 458 can be made of a wicking material that can provide a capillary action or the ability to draw another substance, in this case moisture, into it. Wicking layer 458 can have a pre-specified color when dry and no foreign substance has been wicked into it. For example, wicking layer 458 can have an "unwicked" color that is typically white but could also be gray, a light color, etc. In order to accentuate the change in color when exposed to moisture, ink layer 462 can be provided that partially obscures wicking layer 458. Ink layer 462 can be colored to contrast with the "wicked" color of wicking layer 458 in order to provide a better viewing experience especially when viewing through the small opening represented by audio jack port 42. For example, if the "unwicked" color of wicking layer 458 is white, then ink layer 462 can be a matching white such that when, and if, wicking layer 458 changes color, that change in color will contrast with the unchanged color of ink layer 462 making the color change even more readily apparent even through the small opening represented by audio jack port 38.

In the described embodiment, dyeing layer 460 can be placed adjacent to wicking layer 458. Dyeing layer 460 can be made of a dry dye, or colored substance, of a predefined color, typically red. When dyeing layer 460 is in dry form, wicking layer 458 has no wicking ability so that the two remain separated. Once dyeing layer 460 becomes moist or wet, the dry dye becomes wet and is wicked into wicking layer 458. In this way, wicking layer 458 can become viewable through viewing port 452 having a shape influenced by ink layer 462 where the dye has a color that contrasts with that of ink layer 462. When there has been no moisture infiltration of the dry dye, wicking layer 458 appears to have a dry color, such as white, through viewing port 452 as no wicking has occurred. However, when moisture infiltrates the dry dye, the dye, now wet, wicks into and through wicking layer 458 such that the color of the dye that passes into wicking layer 458 is apparent through viewing port 452. Once the dye has been wicked into wicking layer 458, the dye will remain even after wicking layer 458 dries.

Figure 19:
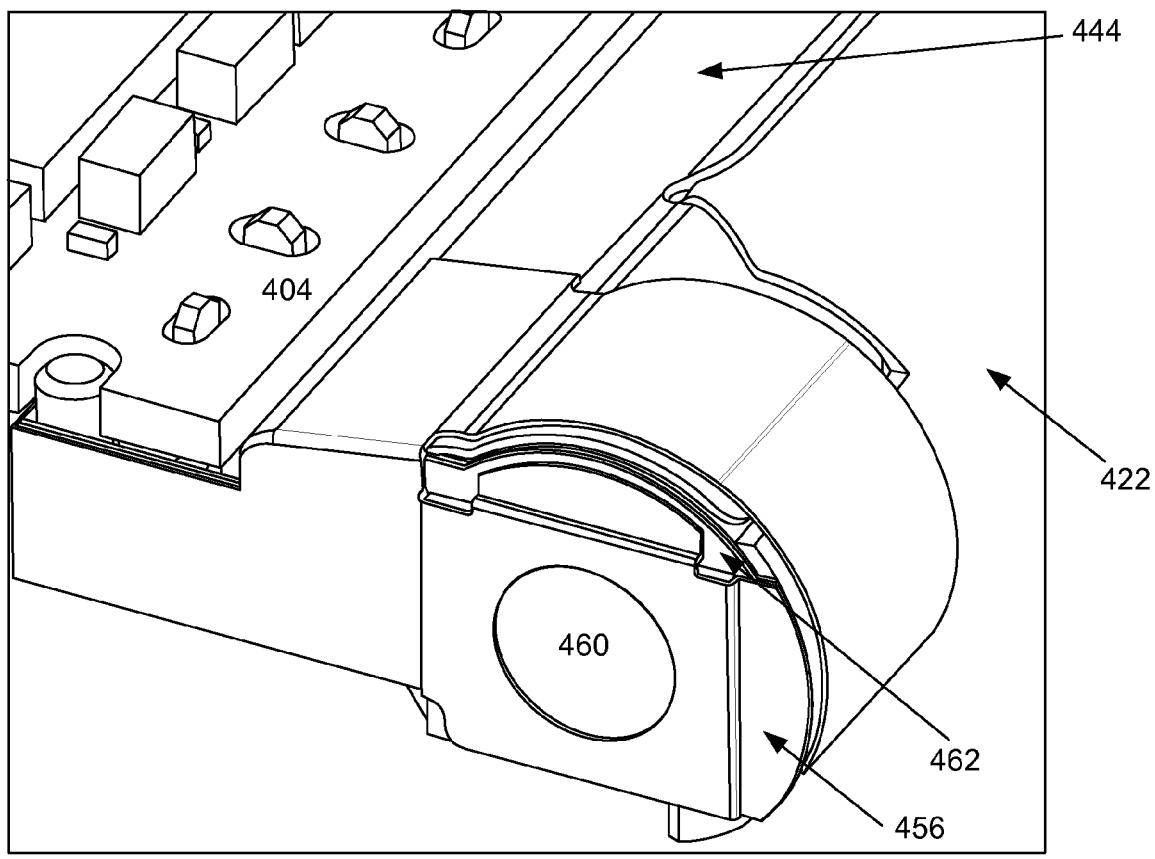

FIG. 19 shows an external view of moisture detection system 450.

Figure 20:
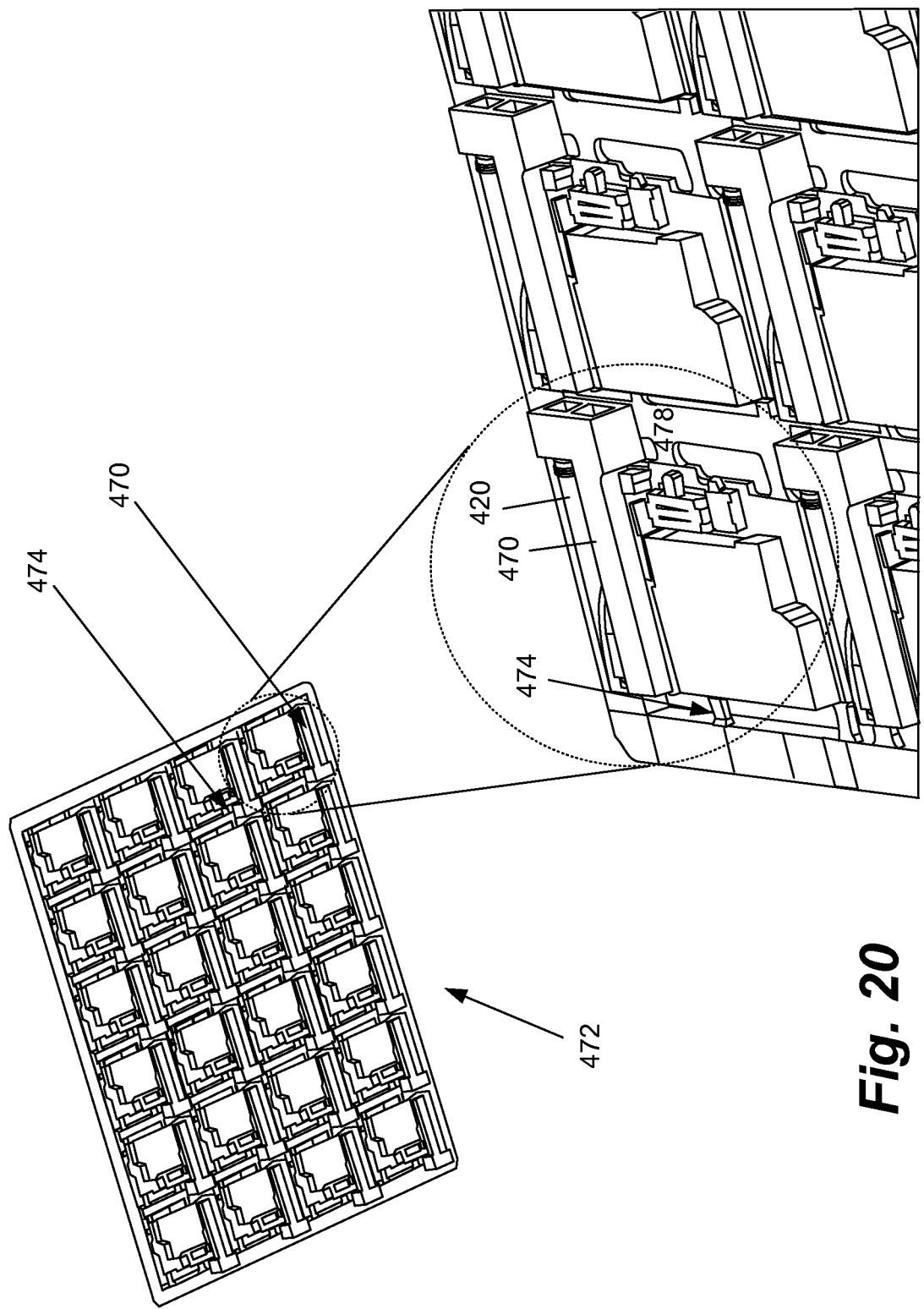
FIG. 20 shows an assembly tool used to surface mount an audio jack assembly to a panelized printed circuit board in accordance with the described embodiments.

In order to facilitate the placement of audio jack assembly 420 onto PCB 404, assembly tool 470 can be used to support and align audio jack assembly 420 onto PCB 404. Accordingly, FIG. 20 shows panel 472 formed of a plurality of PCBs connected together by way of tabs 474. As well known in the art, printed circuit boards are generally fabricated in large numbers in the form of a sheet, or panel, of printed circuit boards bound together by panel tabs. After all appropriate circuits and assemblies have been mounted to the panelized PCB, the integrated circuits and assemblies can be electrically connected to traces in the PCB using any number of connection processes such as soldering using, for example, a wave soldering process. However, prior to the connecting process, audio jack assembly 420 can be placed upon PCB 404 without substantial support. In this way, there is a possibility of audio jack assembly moving or otherwise becoming mis-aligned either before or during the soldering process.

Accordingly, assembly tool 470 can be used to place and temporarily secure audio jack assembly 420 to each of the PCBs in PCB panel 472. Assembly tool 470 can take the form of a post that can be placed within port 48 having a length such that the post can extends completely through audio jack barrel 422 (also referred to as "spearing"). In this way assembly tool 470 can be supported by tab structure 478 and PCB 404. In this way, assembly tool 470 can support each of the panelized PCBs. In this way, audio jack assembly 420 can be surface mounted to the corresponding one of the panelized PCBs while supported by assembly tool 460. After audio jack assembly 420 has been successfully surface mounted, assembly tool 470 can be removed and discarded.

Figure 21:
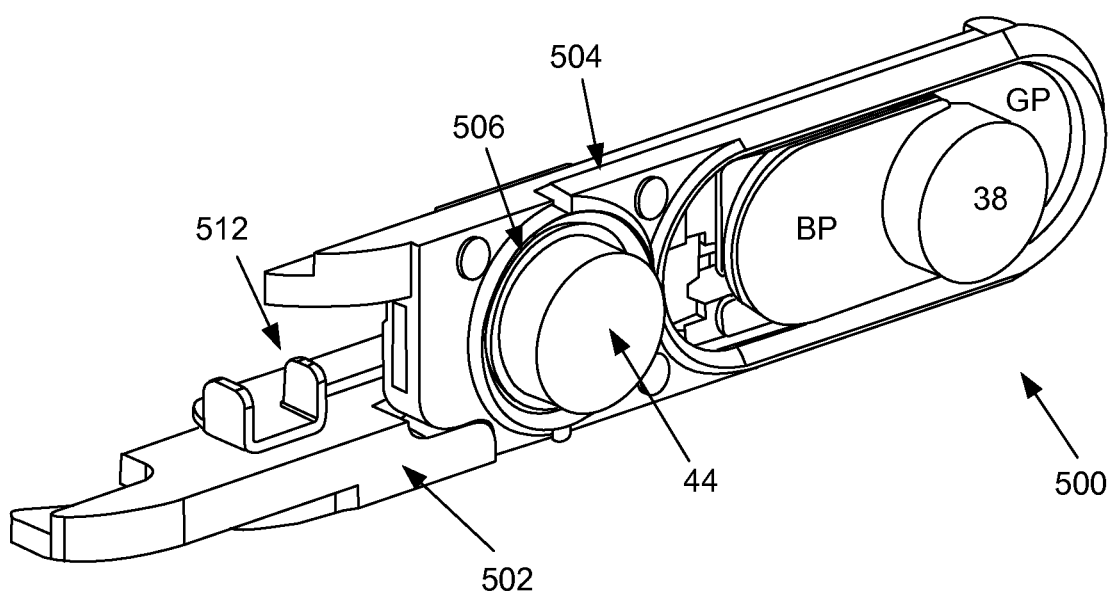
FIGS. 21-24 show aspects of hold button assembly in accordance with the described embodiments.
Figure 22:
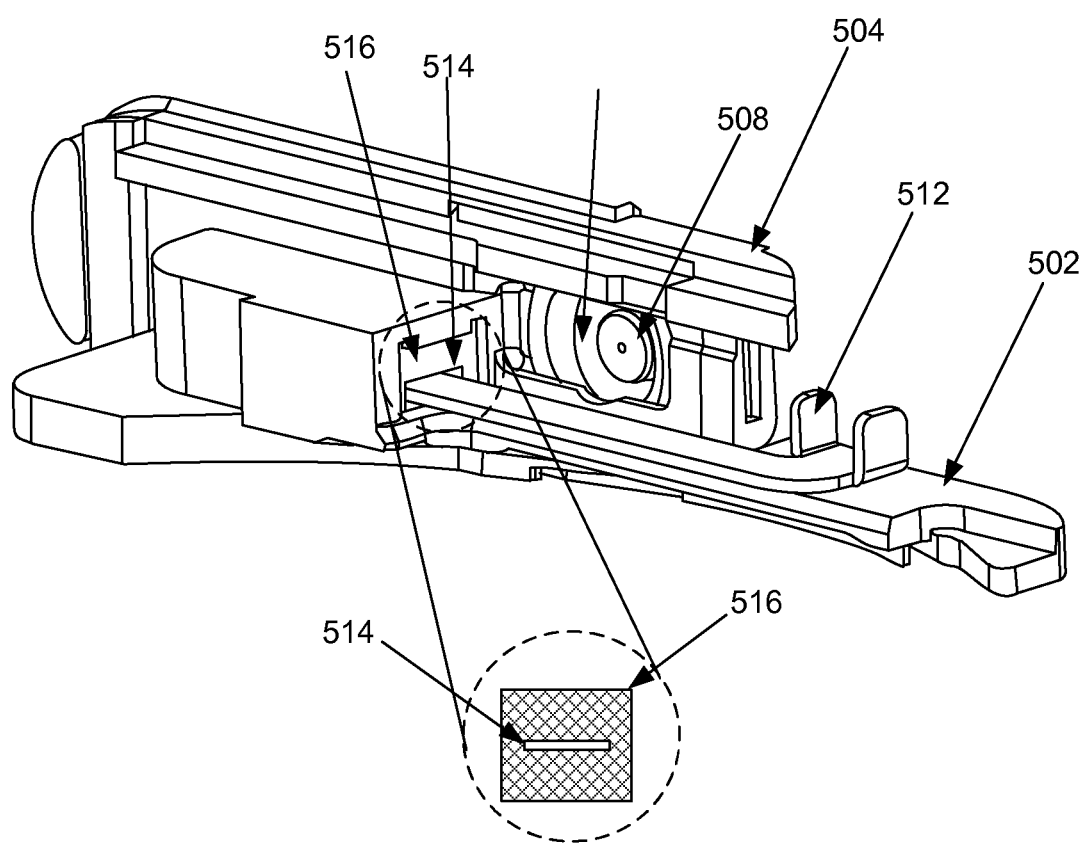

Turning now to FIGS. 21 and 22, hold switch assembly 500 in accordance with the described embodiments is shown in more detail. Hold switch assembly 500 can include hold switch carrier 502. Hold switch carrier 502 can be formed of any suitable resilient material such as plastic. In order to minimize the intrusion of moisture from the external environment through hold switch carrier 502, hold switch carrier seal 504 can be placed on hold switch carrier 502. Hold switch carrier seal 504 can be formed of moisture inhibiting material such as silicone rubber. In this way hold switch carrier seal 504 can have a shape that snug fits within hold switch carrier 502. Moreover, hold switch carrier seal 504 can have a number of openings that allow passage of mechanical actuators. For example, playlist button 44 can be accommodated by opening 506 in hold switch carrier seal 504. However, in order to minimize the likelihood of moisture entering the interior of media player 10, playlist button plunger 508 that extends from playlist button 44 to playlist tact switch 412 can pass through hold switch carrier seal 504 through opening 510 in such a way that effectively seals playlist button plunger 508 leaving little or no room for moisture to pass from the external environment to the interior of media player 10.

In order to further reduce the likelihood of moisture gaining access to the interior of media player 10, hold switch arm 512 attached to hold switch button 38 on one end and hold switch side firing tact switch 414 on the other end can pass through slit 514 formed in hold switch seal block 516. Hold switch block seal 516 can be formed of resilient material such as silicone rubber and can be tightly fitted in carrier 502. Pressure applied to block seal 516 can compress the silicone rubber about that portion of arm 512 in slot 514 with substantially affecting the movement of arm 514. In this way, any moisture present at hold button 38 can be prevented from entering the interior of media player 10.

Figure 23:
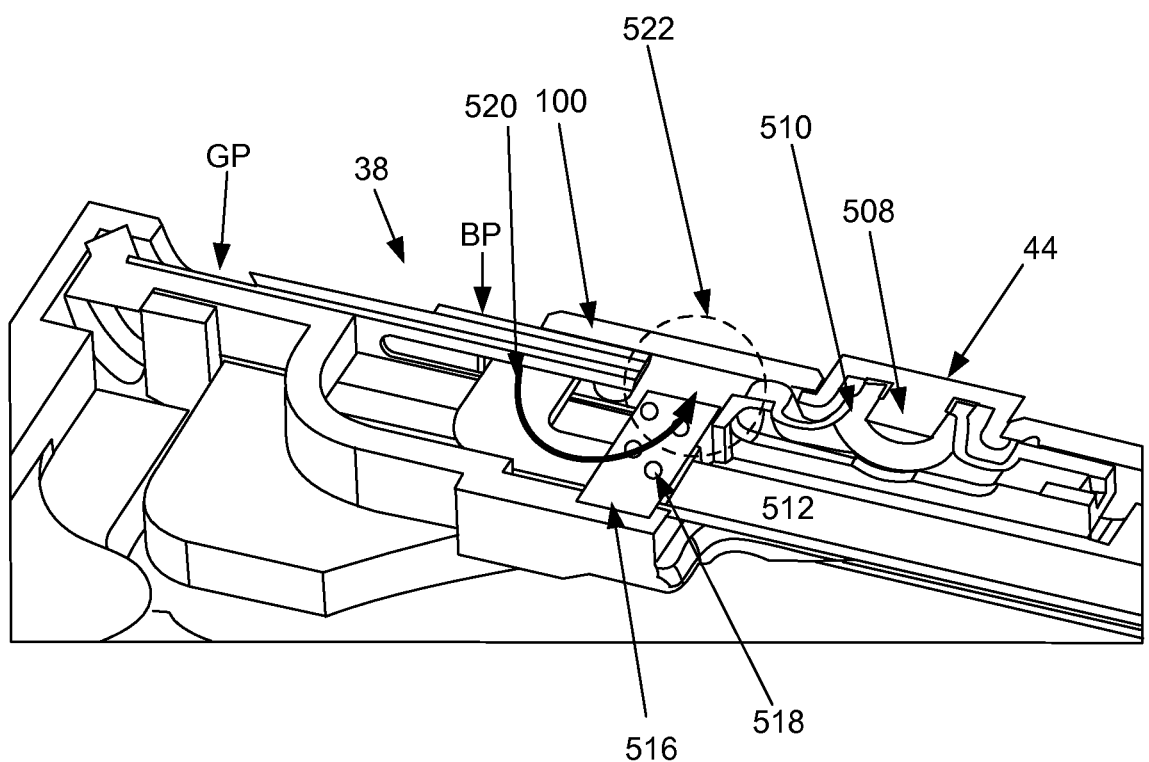

It should be noted that in some cases it can be advantageous from an ESD mitigation standpoint to dope the silicone rubber of block seal 516 with conductive material such as silver spheres 518 shown in FIG. 23. Conduction path 520 from hold switch 38 to chassis ground at housing 100 by way of arm 512 can be provided. In this way, any electric charge at or near hold switch 38 can be conducted to chassis ground in the form of housing 100. It should be noted, however, that in order to provide a good electrical contact point at housing 100, portion of the surface layer (if any) of housing 100 must be removed in order to expose the metallic substrate. For example, in the case of housing 100 being formed of anodized aluminum, laser etching portion 522 of housing 100 can provide a good electrical contact for doped and therefore electrically conductive seal 516.

Figure 24:
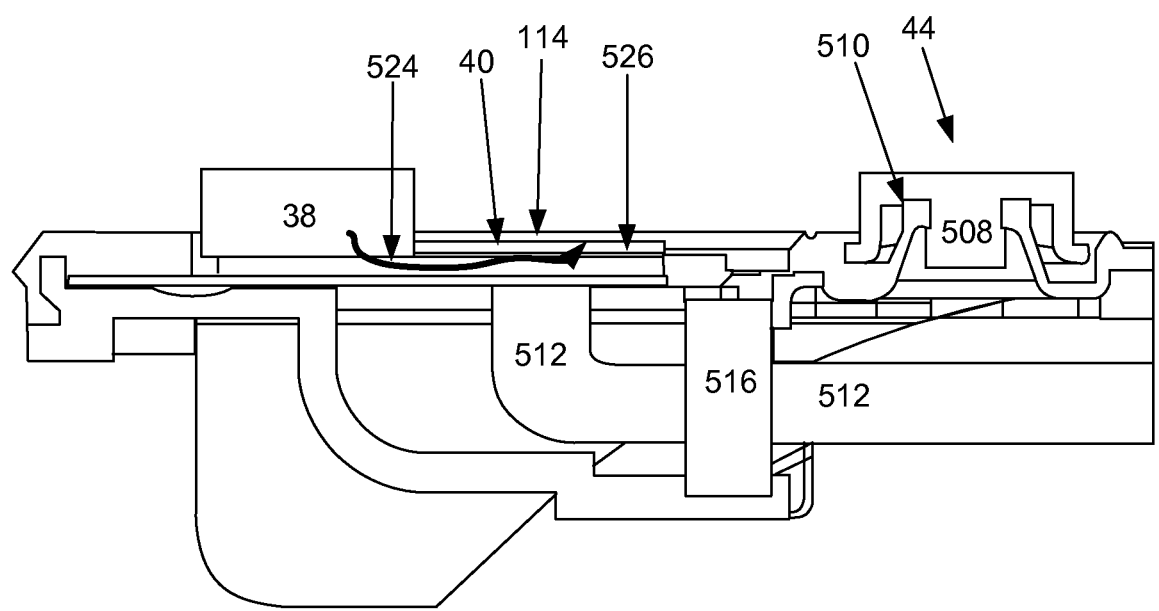

FIG. 24 shows another embodiment of hold switch assembly 500 in which conduction path 524 can be provided between hold switch button 38 and housing 100. Metallic label 40 can be attached to hold switch arm 512 using conductive adhesive along the lines of solder forming conductive layer 526 between label 40 and hold switch arm 512. In this way, charge on hold switch button 38 can be directed along conduction path 524 to housing 100. However, in order to assure a good electrical contact between hold switch arm 512 and housing 100, portion 114 of housing 100 can be abraded to expose the underlying metal substrate, which in this example is aluminum. In one embodiment, the surface layer associated with portion 114 can be removed using a laser to etch an appropriate amount of the surface layer from portion 114. In this way, hold switch arm 512 moves such that label 38 comes in direct contact with the underlying metal layer of housing 100 at laser etched portion 114.

It should be noted that in addition to providing a good electrical contact point, by exposing the softer aluminum under layer of housing 100 to metal label 38 at portion 114, wear and tear on label 38 is substantially reduced. For example, when the aluminum of housing 100 is anodized, the surface layer formed is very hard to the point that label 38, even when formed of stainless steel, can be scratched or otherwise damaged by the repeated sliding against the surface layer of the anodized aluminum of housing 100. However, when laser etched, the native aluminum under layer of housing 100 exposed in portion 114 does not appreciably damage or otherwise mar label 38.

Figure 25:
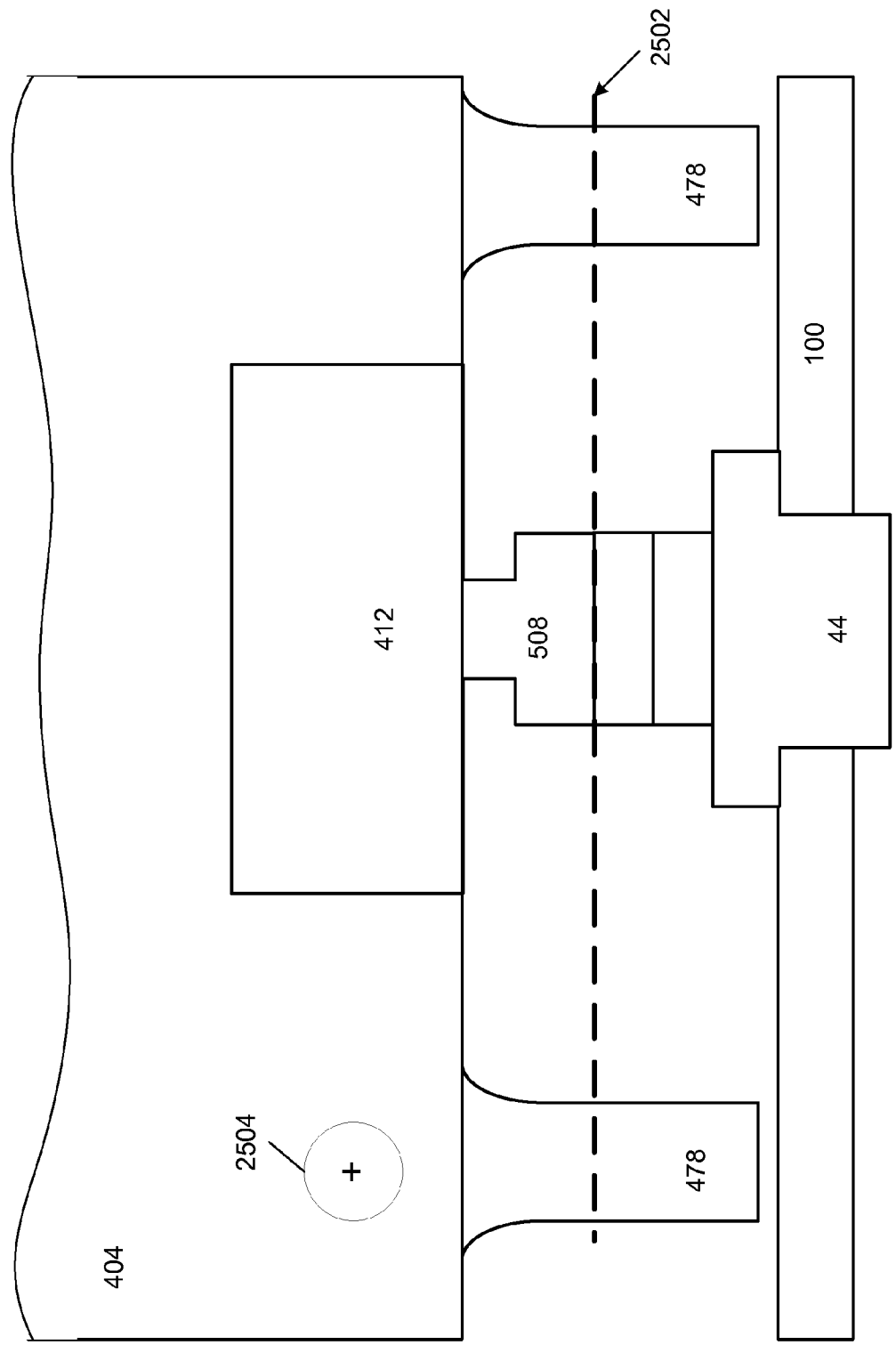
FIG. 25 shows a technique for reducing a tolerance stack of a playlist button to housing in accordance with an embodiment of the invention.

Due to the very small size of media player 10, it can be difficult and time consuming to properly align external features, such as playlist button 44 to housing 100. FIG. 25 shows a particularly useful alignment technique used to install and align playlist button 44 (or any other external feature) in accordance with the described embodiments. In particular, FIG. 25 shows PCB 404 on which at least a portion of tabs 478 remain. Playlist button 44 can include plunger 508 that can press upon on playlist tact switch 412. In order to minimize the tolerance stack between playlist button 44 and housing 100, tabs 478 can be laser cut at laser cut line 2502 as opposed to fiducials 2504 on PCB 404. In this way, the tolerance stack can be greatly reduced substantially improving the look and feel of playlist button 42.

Figure 26:
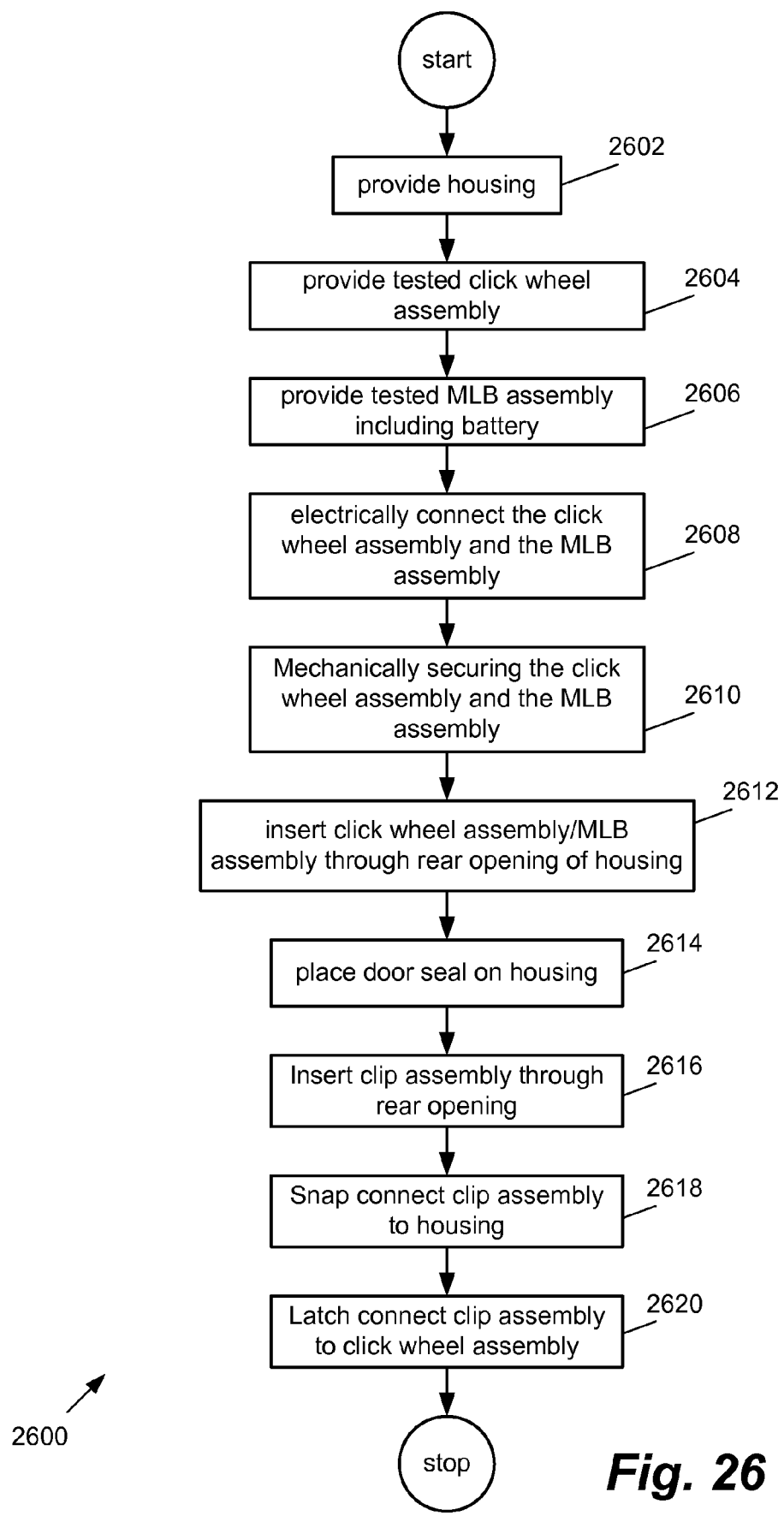
FIG. 26 shows a flowchart detailing an assembly process in accordance with the described embodiments.

FIG. 26 shows a flowchart detailing assembly process 2600 in accordance with the described embodiments. Assembly process 2600 can begin at 2602 by providing housing. The housing can be formed of metal or any other appropriate material. The housing can also include a number of openings sized and placed to accommodate the insertion and assembly of various internal components. In the described embodiment, the housing includes at least a front opening suitably sized to accommodate a click wheel assembly and a rear opening suitably sized to accept a clip assembly. In any case, the media player is assembled using what is referred to as an inside-out assembly technique described in more detail below. Once the housing has been provided, a fully assembled and functionally tested input device that can take the form of a click wheel assembly can be provided at 2604. The click wheel assembly can include a front facing click wheel having a number of input features that can be activated by a user. For example, the input features can take the form of clickable switches that can react to a user press event by engaging a actuator arranged to generate a signal in accordance with the press event. The click wheel assembly can also include a dual purpose metal plate having an outward facing surface having the actuators for generating the signal and an inwardly facing surface having an attachment feature used to secure internal components such as a main logic board assembly, or MLB. At 2606, a fully assembled and functionally tested MLB can be provided. The MLB can include a number of integrated circuits, switches, and I/0 devices. The switches can include at least a direct firing playlist button tact switch and a side firing hold button tact switch laterally displaced from an external hold button. The MLB can also include a surface mounted audio jack assembly and a battery.

At 2608 the MLB assembly and the click wheel assembly can be electrically connected to each other by way of a flex connector from the click wheel assembly to a zero insertion force, or ZIF, electrical connector at the MLB assembly. At 2610, the MLB assembly and the click wheel assembly are mechanically coupled to each other. In the described embodiment, the boss on the inwardly facing surface of the metal plate of the click wheel assembly accepts a fastener such as a screw. The screw is used to mechanically secure the MLB assembly to the click wheel assembly. Next at 2612, the click wheel assembly/MLB assembly is inserted into the rear opening of the housing and aligned with the front opening of the housing. The playlist button and the hold button are aligned with corresponding openings in the housing as is the audio jack unit. At 2614, a door seal is placed on an outer edge of the rear opening. The door seal is formed of resilient material such as silicone rubber and inhibits the flow of moisture/contaminants from the external environment to an inside of the media player.

Next at 2616, the clip assembly is inserted into the rear opening and at 2618 the clip assembly is snap connected to the housing using flanges on the housing at about the same time as the clip assembly is latch connected to latching features on the click wheel assembly at 2620.

Figure 27:
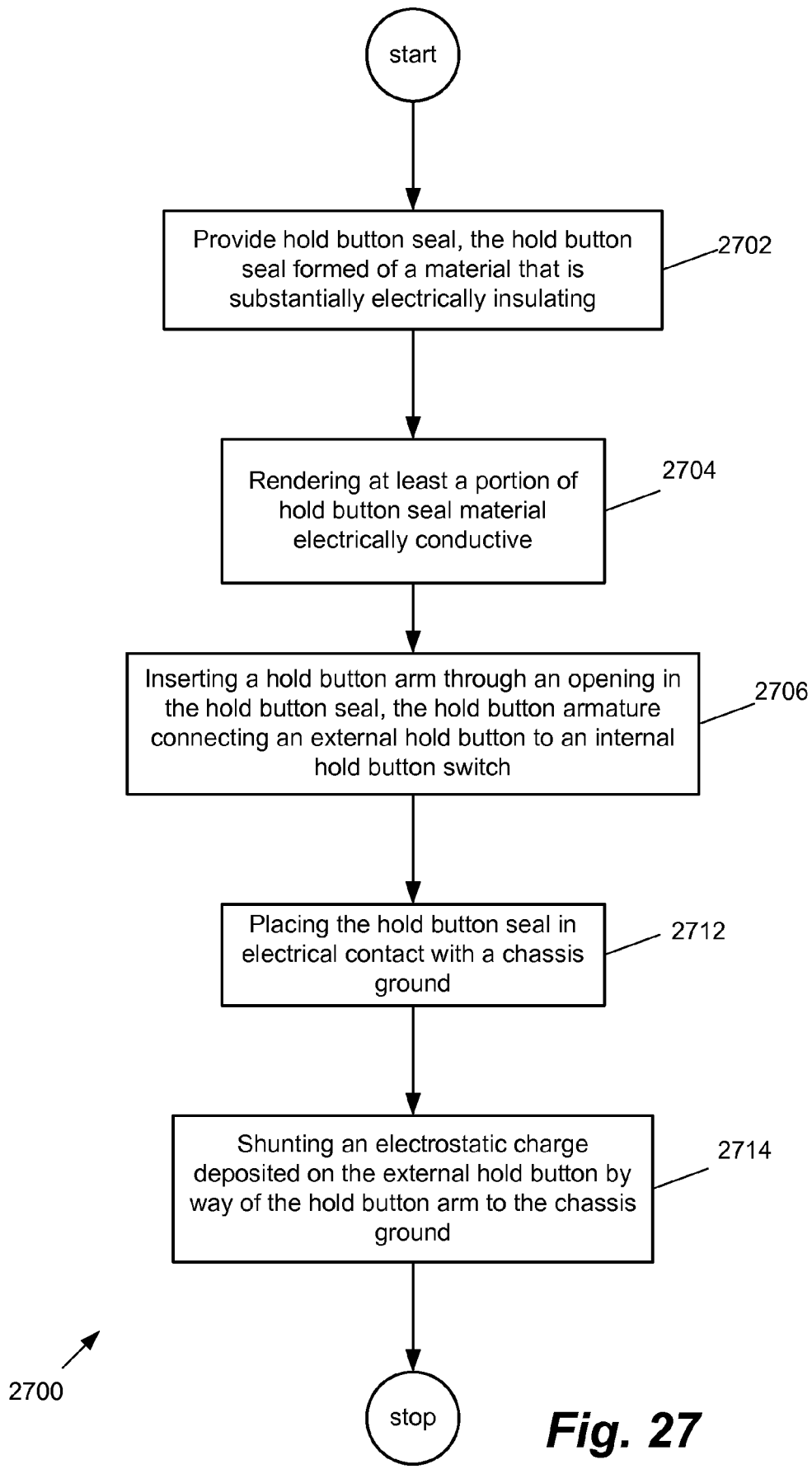
FIG. 27 shows a flowchart detailing a process for shunting an electrostatic charge to a chassis ground in accordance with the described embodiments.

FIG. 27 shows a flowchart detail process 2700 for providing ESD protection in portable device in accordance with the described embodiments. Process 2700 can be used to shunt an electrostatic charge deposited on a hold button to a chassis ground, which in this example is the housing. Process 2700 can be carried out by providing a hold button seal formed of a material that is substantially electrically insulating at 2702. In the described embodiment, the hold button seal can be formed of resilient material such as silicone rubber. In general the materials used to form the hold button seal are generally insulating in nature in that they generally do not facilitate a charge flow. At 2704, at least a portion of the hold button material is rendered electrically conductive. In the described embodiment, the changing of at least the portion of the hold button seal from insulating to conduction can be achieved by doping the portion of the hold button material with conducting dopant material such as silver micro-spheres. At 2706, the doped hold button seal is used to enclose a hold button arm that mechanically links an external hold button to an internal hold button switch. At 2708, the conductive portion of the hold button seal is placed in electrical contact with chassis ground. In the described embodiment, the chassis ground can take the form of an electrically conductive housing formed of, for example, aluminum. Next at 2710, any electrostatic charge deposited on the external hold button is shunted away from the internal hold button switch to the chassis ground.

Figure 28:
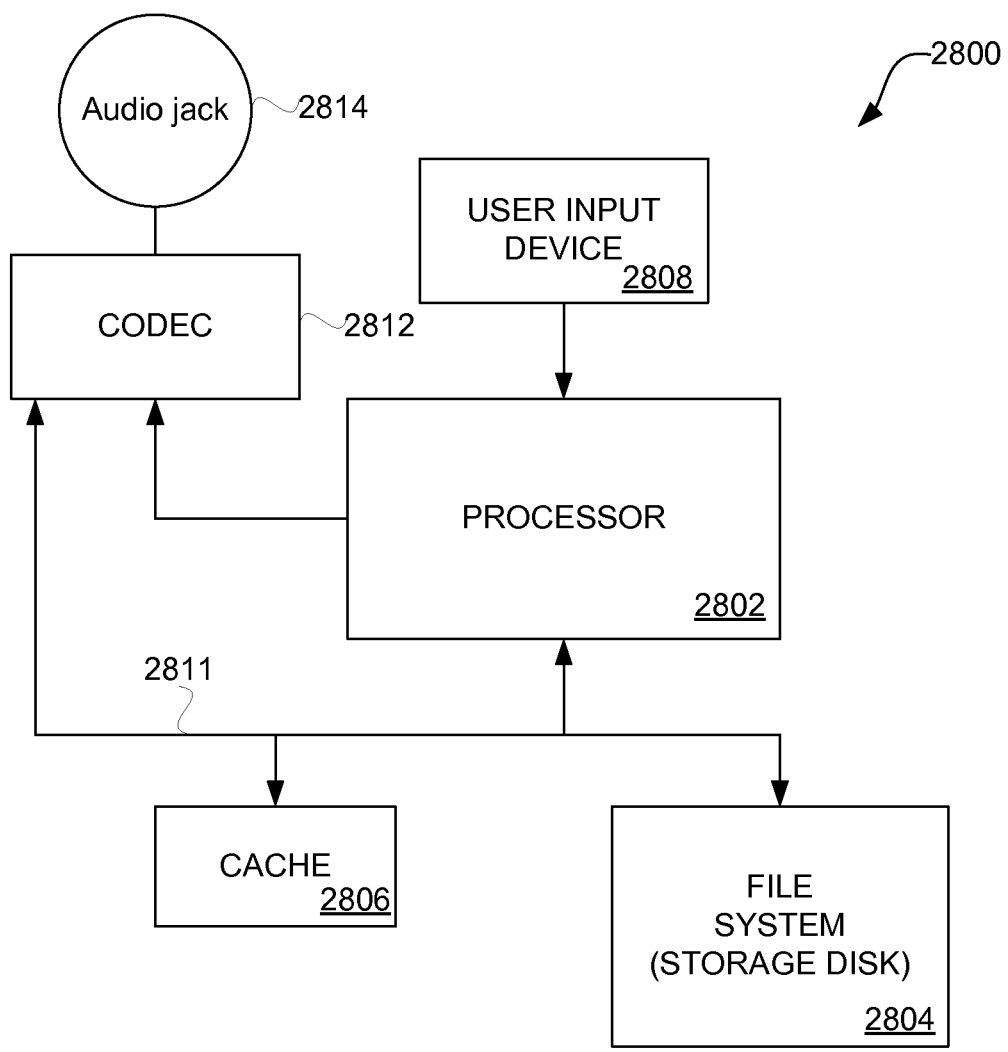
FIG. 28 shows a representative media player in accordance with the described embodiments.

FIG. 28 is a block diagram of media player 2800 in accordance with the described embodiments. Media player 2800 includes processor 2802 that pertains to a microprocessor or controller for controlling the overall operation of media player 2800. Media player 2800 stores media data pertaining to media items in a file system 2804 and a cache 2806. The file system 2804 is, typically, a storage disk or a plurality of disks. The file system typically provides high capacity storage capability for media player 2800. However, since the access time to the file system 2804 is relatively slow, media player 2800 also includes a cache 2806. The cache 2806 is, for example, Random-Access Memory (RAM) provided by semiconductor memory. The relative access time to the cache 2806 is substantially shorter than for the file system 2804. However, the cache 2806 does not have the large storage capacity of the file system 2804.

Further, the file system 2804, when active, consumes more power than does the cache 2806. The power consumption is particularly important when the media player 2800 is a portable media player that is powered by a battery (not shown).

Media player 2800 also includes a user input device 2808 that allows a user of media player 2800 to interact with media player 2800. For example, the user input device 2808 can take a variety of forms, such as a button, keypad, dial, etc. Still further, the media player 2800 includes data bus 2810 can facilitate data transfer between at least the file system 2804, the cache 2806, the processor 2802, and the CODEC 2812.

In one embodiment, media player 2800 serves to store a plurality of media items (e.g., songs) in the file system 2804. When a user desires to have the media player play a particular media item, a list of available media items is displayed on the display 2810. Then, using the user input device 2808, a user can select one of the available media items. The processor 502, upon receiving a selection of a particular media item, supplies the media data (e.g., audio file) for the particular media item to a coder/decoder (CODEC) 2812. The CODEC 2812 then produces audio output signals for audio jack 2814 to output to an external circuit. For example, headphones or earphones that connect to media player 2800 would be considered an example of the external circuit.

In another embodiment, a computer-readable medium is provided that includes computer program instructions for performing the various steps of assembly described in FIG. 26. Specifically, the computer program instruction may act to control various automatic installation components, such as, for example, robotic arms, automatic screwdrivers, etc. That can assembly the device without the need for human intervention (or, at least, minimizing human intervention). In this way, the computer instructions may be programmed to control a machine to insert various components into the housing without substantial human intervention. The computer instructions can also be programmed to control a machine to perform laser etching and laser routing in addition to any other process required for the assembly and testing of the media player.

FIGS. 29-32 illustrate techniques and structures well suited for forming a moisture ingress seal for audio jack assembly 420 in accordance with the described embodiments. It should be noted that although discussed in terms of audio jack assembly 420, the described techniques and structures can be used in almost any apparatus operated and constructed in such a way that at least one portion is water tolerant while another in close proximity must remain water intolerant. A good example of such a situation is audio jack assembly 420 where internal volume 428 of barrel 424 must be water tolerant since audio port 42 is exposed to the external environment without any pre-conditions. For example, portable media player 10 can be immersed in liquid such as water making it highly likely that water will enter internal volume 428 through audio port 42 (presuming of course that no audio post is inserted into audio jack barrel 422). The presence of water in internal volume 428 is generally not a problem, however, moisture intrusion path 432 can provide a mechanism whereby water present in interior volume 428 can make its way into the interior of media player 10.

Therefore, the water present in internal volume 428 must be effectively prevented from accessing path 432 (or any other route for that matter) in a cost effective and manufacturing efficient manner. A particularly useful approach to sealing internal volume 428 relies upon forming a sealing structure that effectively blocks the migration of moisture from internal volume 428 and the interior of media player 10. In one embodiment, the sealing structure can be used to seal electrical contact(s) 430. The electrical contact sealing structure can be formed in such as way to include a primary seal and a subsequently applied finishing seal. In one implementation, the primary seal can be formed of a layer of sealing tape pressured applied to a portion of the electrical contact and audio jack housing. Subsequent to the formation of the primary seal, a finishing seal can be formed during a component attachment process in which an electrical connector is electrically connected to an exposed portion of the electrical contact. The component attachment process can take many forms. In the described embodiment, however, the component attachment process can take the form of a surface mounting assembly (SMA) technique. One particularly useful SMA technique referred to as solder reflow relies upon heating solder paste associated with a connector flex to form liquid solder. The liquid solder can then flow in and around a junction area of the flex connector and the exposed portion of the electrical contact. When allowed to cool, the liquid solder solidifies in place providing an electrically conductive path between the connector flex and the electrical contact by way of the exposed portion. The solidified solder can also seal a region between the sealing tape and the exposed portion of the electrical contact. In this way, the solder can provide a mechanism for forming electrical connections as well as sealing the same electrical connections providing a cost effective and efficient manufacturing operation well suited for enhancing the resistance to water intrusion of media player 10.

Figure 29:
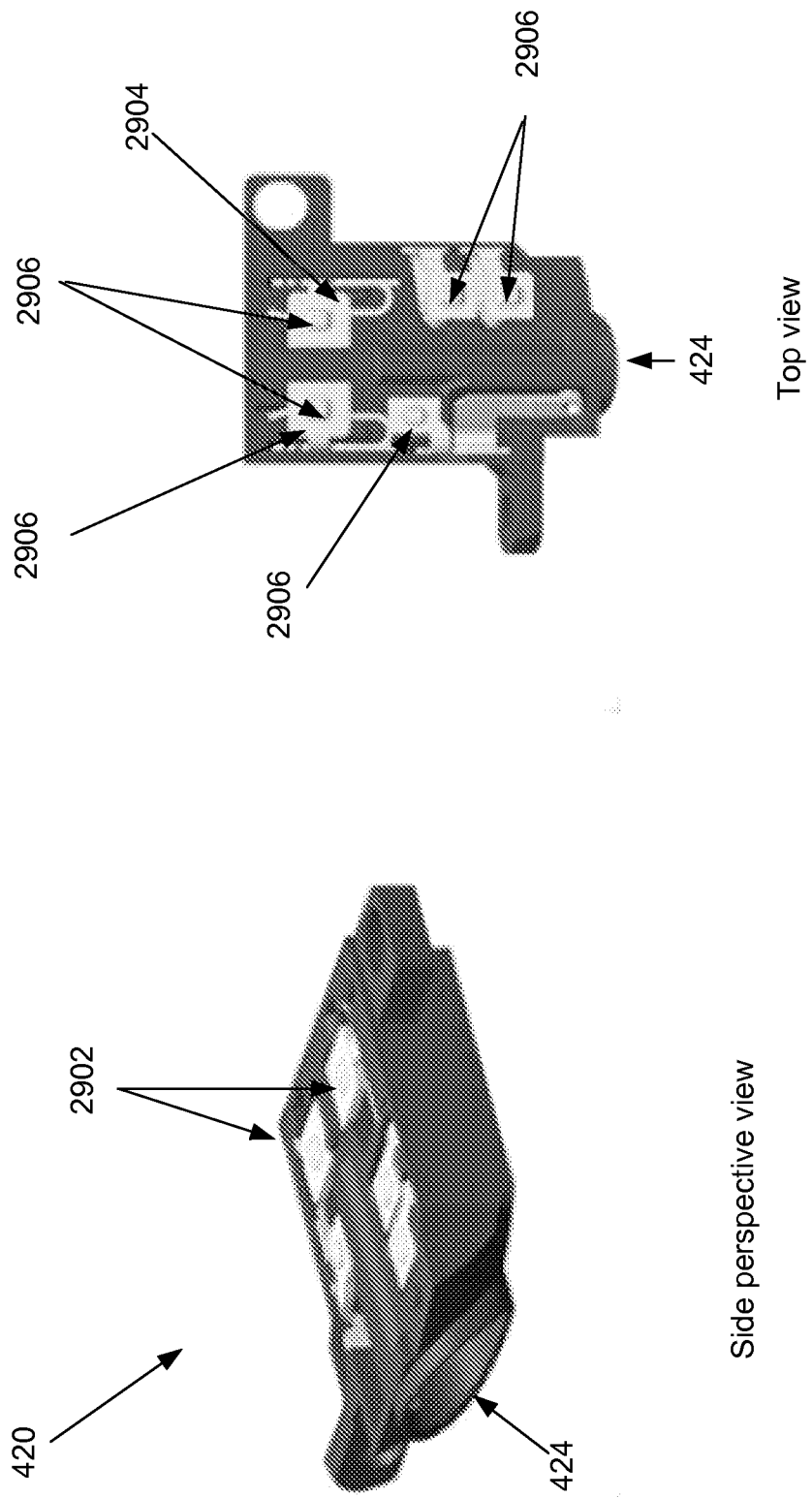
FIGS. 29-32 illustrate techniques and structures well suited for forming a moisture ingress seal for audio jack assembly in accordance with the described embodiments.
Figure 30:
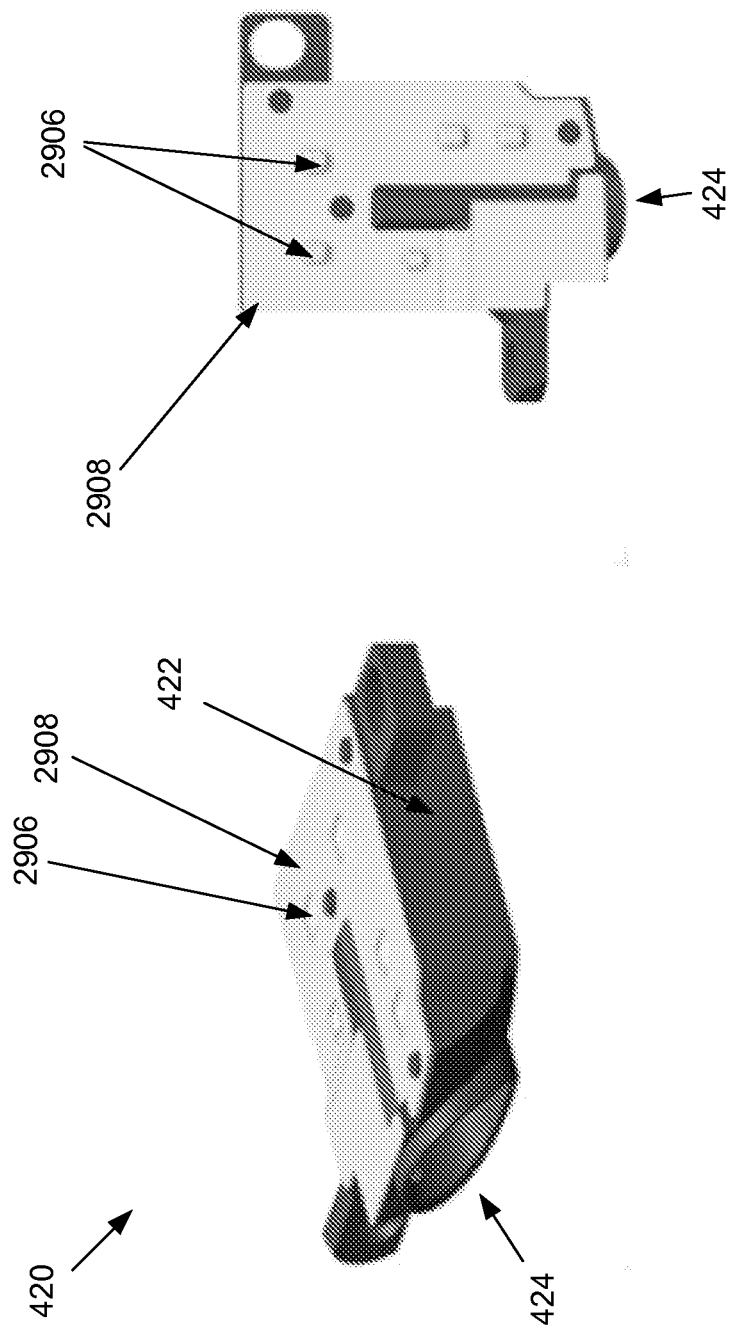
Figure 31:
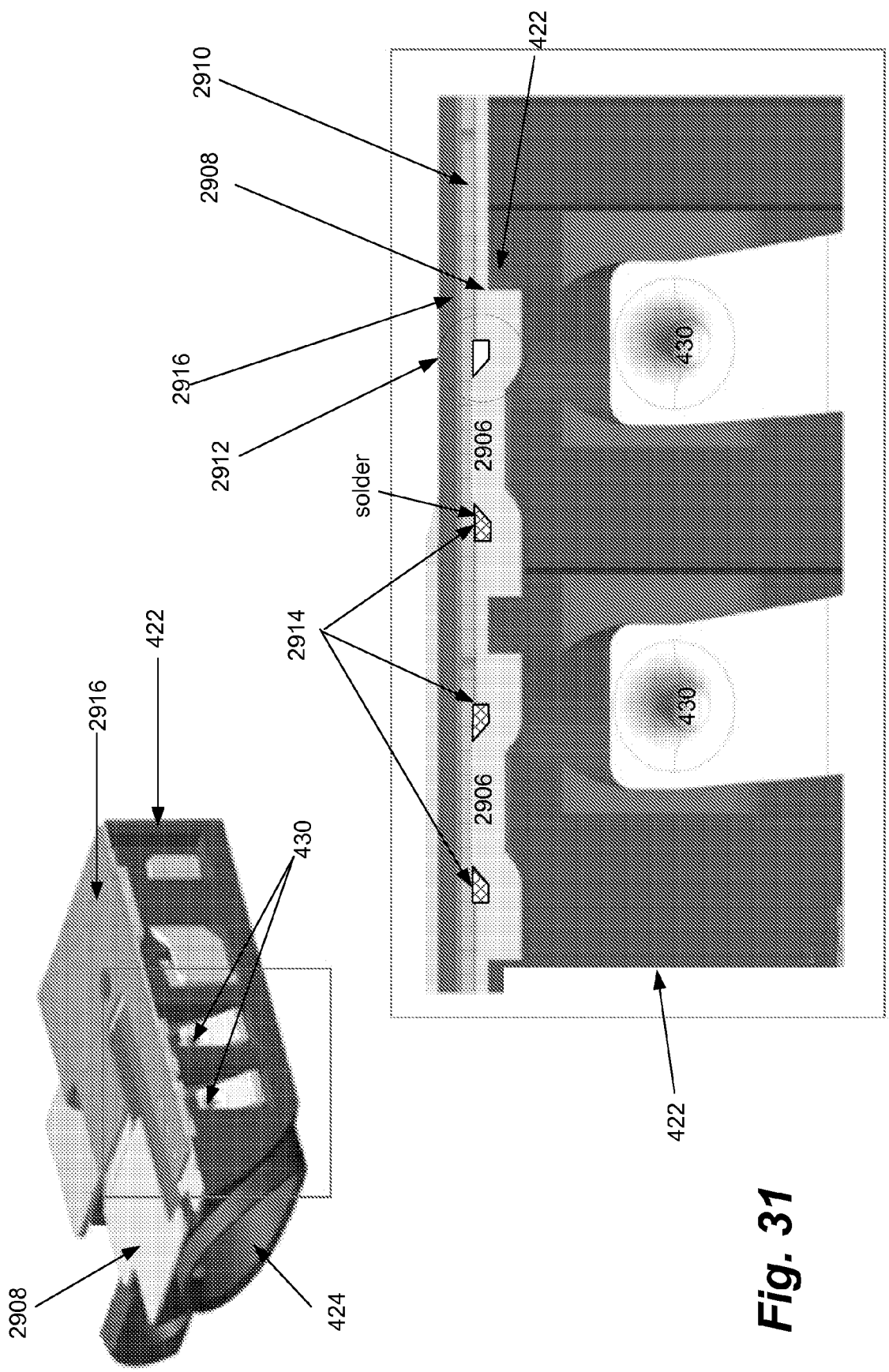

FIG. 29 shows an implementation of audio jack assembly 420 described above. In particular, FIG. 29 illustrates electrical contacts 2902. Electrical contacts 2902 can make physical contact with corresponding conducting rings included in an audio post having a size and shape in accordance with audio jack barrel 424. Electrical contact 2902 can, in turn, include (flat) contact pad portion 2904 and (upraised) dimple portion 2906. Pad portion 2904 can be sized to accommodate sealing tape (or film) applied to electrical contact 2902 in such a way that most of dimple portion 2906 remains exposed and free of the sealing tape. For example, as shown in FIG. 30, a primary seal can take the form of sealing tape layer 2908 that can be created by applying sealing tape to both audio jack body 422 and contact pad portion 2904. In this way, most of dimple portion 2906 remains exposed. The sealing tape can take many forms. For example, the sealing tape can be pressure applied tape along the lines of Kapton™. Once sealing tape layer 2908 has been formed, flex substrate 2910 can be overlaid onto sealing tape layer 2908 as shown in FIG. 31. During a subsequent solder reflow process that electrically connects flex substrate 2910 to electrical contact 430 by way of dimple portion 2906, a finishing seal can be created using solder paste associated with flex substrate 2910. In this embodiment, the solder paste can be heated to at least its melting point to form liquid solder. The solder, now in liquid form, can flow into junction regions 2912 between dimple portion 2906 and sealing tape layer 2908. The freely flowing solder can fill any voids and gaps between sealing tape layer 2908 and dimple portion 2906. For example, junction region 2912 can include voids or gaps that can provide an intrusion path for water into the interior of media player 10. Therefore, by allowing the liquid solder to fill these gaps and voids in junction region 2912, when allowed to cool and return to a solid state, the flowed solder within junction region 2912 can form seal 2914 that effectively prevents any water intrusion using junction region 2912. In this way, seal 2914 can effectively seal electrical contacts 2902 preventing water from passing from interior portion 428 and the interior of media player 10.

Figure 32:
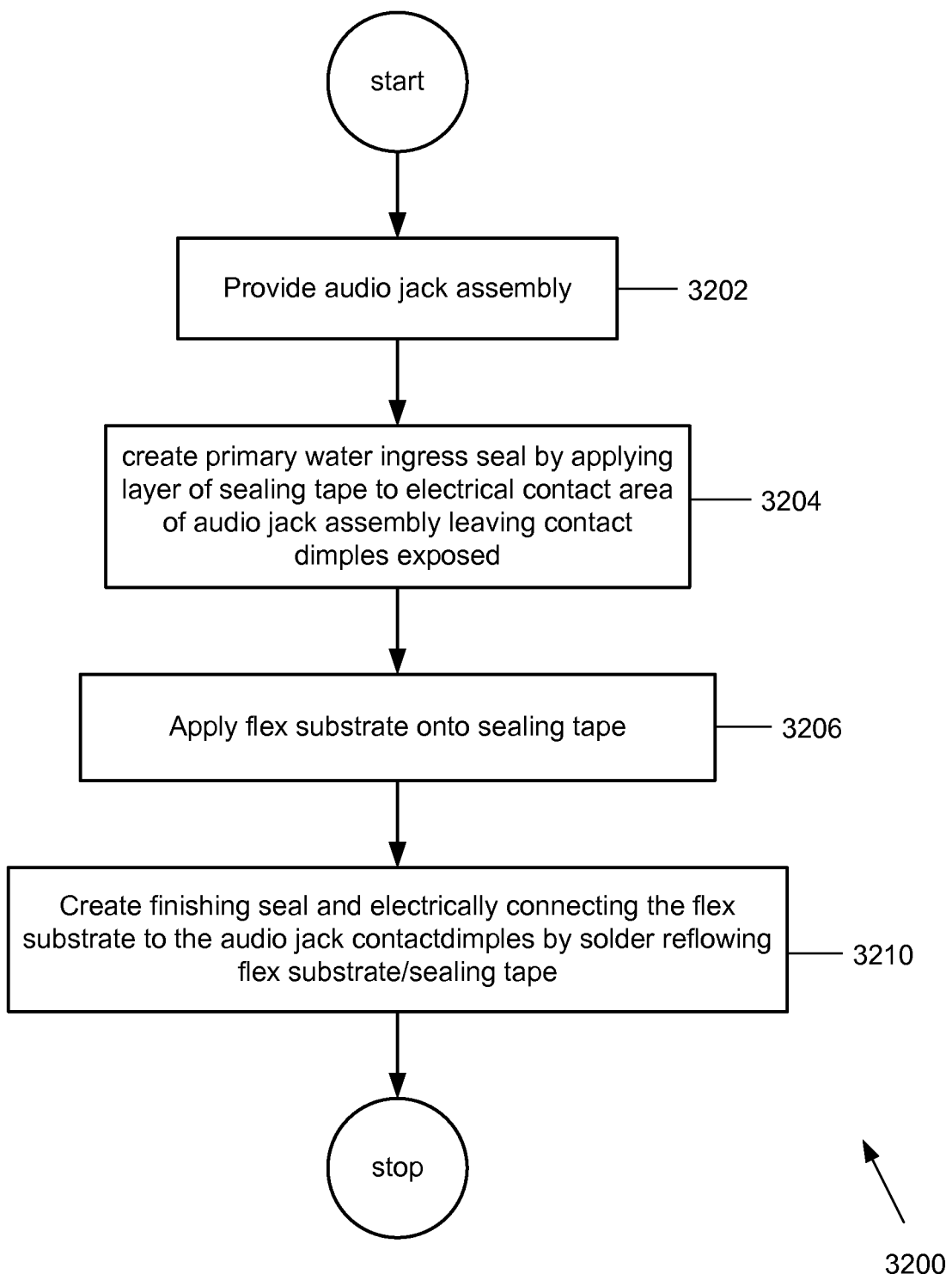

FIG. 32 shows a flowchart detailing process 3200 in accordance with the described embodiments. Process 3200 can be carried out by providing an audio jack assembly at 3202. Next, at 3204, a primary water ingress seal is formed by applying a layer of sealing tape to an electrical contact of the audio jack assembly. The electrical contacts are formed of a flat pad area and an upraised portion, referred to as a dimple. In the described embodiment, the dimple remains exposed. Next at 3206, a flex substrate layer is applied to the housing making direct contact only with the dimples of the electrical contacts, the flat pad portion being protected by the sealing tape applied thereon. Next at 3204, a finishing seal is created by performing a solder reflow operation on the audio jack assembly. The solder reflow operation causes solder paste associated with the flex substrate to electrically connect the flex substrate to the electrical contacts by way of the dimples. The solder reflow process also causes the solder paste to flow into recesses surrounding the dimpled portions. When the solder cures, the cured solder seals the dimples, sealing tape, and housing preventing water from intruding into the media player by way of the audio jack contacts.

The various aspects, embodiments, implementations or features of the described embodiments can be used separately or in any combination. Various aspects of the described embodiments can be implemented by software, hardware or a combination of hardware and software. The described embodiments can also be embodied as computer readable code on a computer readable medium for controlling manufacturing operations or as computer readable code on a computer readable medium for controlling a manufacturing line. The computer readable medium is any data storage device that can store data which can thereafter be read by a computer system. Examples of the computer readable medium include read-only memory, random-access memory, CD-ROMs, DVDs, magnetic tape, and optical data storage devices. The computer readable medium can also be distributed over network-coupled computer systems so that the computer readable code is stored and executed in a distributed fashion.

The foregoing description, for purposes of explanation, used specific nomenclature to provide a thorough understanding of the described embodiments. However, it will be apparent to one skilled in the art that the specific details are not required in order to practice the invention. Thus, the foregoing descriptions of specific embodiments are presented for purposes of illustration and description. They are not intended to be exhaustive or to limit the invention to the precise forms disclosed. It will be apparent to one of ordinary skill in the art that many modifications and variations are possible in view of the above teachings.

What is claimed is:

1. A moisture barrier for use with an accessory connector, the moisture barrier suitable for preventing moisture from intruding into an interior of a consumer electronic product having a housing, comprising:
a structural support element having a size and shape in accordance with an opening in the housing, associated with the accessory connector;
an electrical contact supported by the structural support element, the electrical contact comprising a flat, pad portion and a central upraised portion;
a moisture barrier layer covering only the pad portion of the electrical contact; and
a flexible conductive layer electrically connected to the electrical contacts by way of the upraised portion using reflowed solder, wherein the reflowed solder is disposed within a recessed region between the central upraised portion, and the moisture barrier layer, and wherein the reflowed solder completes both the moisture barrier that prevents passage of moisture to the interior of the consumer electronic product and the electrical connection between the flexible conductive layer and the upraised portion.

2. The moisture barrier as recited in claim 1, wherein the moisture barrier layer is a polyamide film.

3. The moisture barrier as recited in claim 1, wherein another moisture barriers associated with the consumer electronic product includes a pre-formed cap formed of moisture resistant material, the preformed cap shaped and sized to fit over at least a portion of the structural support element, the preformed cap attached to the structural support element using adhesive.

4. The moisture barrier as recited in claim 1, wherein the moisture barrier prevents moisture from passing through the sealed electrical contact when the consumer electronic product is submerged to about 1 meter in depth.

5. The moisture barrier as recited in claim 1, further comprising a second electrical contact, the second electrical contact comprising a flat, pad portion and a central upraised portion, the electrical contact integrally formed with the structural support element, wherein the sealing tape layer and flex substrate layer extend to cover the second electrical contact and any recess regions created around the second electrical contact layer which are filled with reflowed solder.

6. The moisture barrier as recited in claim 1, further comprising a moisture detection system disposed within the housing of the consumer electronic product and capable of determining if any detected moisture in the cavity is due to abusive behavior.

7. The moisture barrier as recited in claim 6, wherein the moisture detection system is located within the housing of the consumer electronic product, in close proximity to the structural support element.

8. The moisture barrier as recited in claim 7, wherein the moisture detection system comprises a water dot, the water dot viewable from an interior of the structural support element.

9. The moisture barrier as recited in claim 1, wherein the small form factor consumer electronic product is a portable media device, and wherein the structural support element is an audio jack housing configured to receive an audio jack.

10. The moisture barrier as recited in claim 1, wherein the moisture barrier layer is a layer of pressure applied tape.

11. A moisture inhibiting barrier for preventing moisture intrusion through an accessory connector of a portable electronic device, the moisture inhibiting barrier comprising:
- an electrical contact comprising:
  - a flat, pad portion, and
  - a central upraised portion;
- a water resistant layer covering only the pad portion of the electrical contact; and
- a flexible connector substrate electrically connected to the electrical contacts by way of the upraised portion with solder, wherein the solder is disposed within a recessed region between the central upraised portion, and the water resistant layer, and wherein the solder completes both the moisture inhibiting barrier that prevents passage of moisture to the interior of the portable electronic device and the electrical connection between the flexible connector substrate and the upraised portion.

12. The moisture inhibiting barrier as recited in claim 11, wherein the accessory connector is a headphone jack connector.

13. The moisture inhibiting barrier as recited in claim 11, wherein the water resistant layer is a polyimide film.

* * * * *